(12) United States Patent
Aoki et al.

(10) Patent No.: US 9,350,318 B2
(45) Date of Patent: May 24, 2016

(54) METHOD FOR MANUFACTURING ELECTRONIC DEVICE, COVER BODY, ELECTRONIC DEVICE, ELECTRONIC APPARATUS, AND MOVING OBJECT

(71) Applicant: Seiko Epson Corporation, Tokyo (JP)

(72) Inventors: Shinya Aoki, Minowa-machi (JP); Masashi Shimura, Suwa (JP)

(73) Assignee: Seiko Epson Corporation (JP)

( * ) Notice: Subject to any disclaimer, the term of this patent is extended or adjusted under 35 U.S.C. 154(b) by 211 days.

(21) Appl. No.: 14/085,948

(22) Filed: Nov. 21, 2013

(65) Prior Publication Data

US 2014/0146451 A1    May 29, 2014

(30) Foreign Application Priority Data

Nov. 26, 2012  (JP) .................................. 2012-257159
Nov. 26, 2012  (JP) .................................. 2012-257160
Nov. 26, 2012  (JP) .................................. 2012-257164

(51) Int. Cl.
*B23K 26/00* (2014.01)
*H03H 9/10* (2006.01)
*B23K 26/22* (2006.01)

(52) U.S. Cl.
CPC .............. *H03H 9/1014* (2013.01); *B23K 26/21* (2015.10); *B23K 26/211* (2015.10); *B23K 26/22* (2013.01); *H03H 9/1057* (2013.01); *H03H 9/1071* (2013.01); *H01L 2224/16* (2013.01); *H01L 2924/1461* (2013.01)

(58) Field of Classification Search
None
See application file for complete search history.

(56) References Cited

U.S. PATENT DOCUMENTS

| | | | | |
|---|---|---|---|---|
| 3,020,454 A | * | 2/1962 | Dixon, Jr. ............. | H01L 23/045 174/50.5 |
| 3,039,175 A | * | 6/1962 | Dixon, Jr. ............. | H01L 23/045 257/E23.184 |
| 3,176,201 A | * | 3/1965 | Dickson, Jr. ........... | H01L 21/00 257/699 |
| 4,203,019 A | * | 5/1980 | Richter .................. | A61N 1/375 219/121.35 |
| 5,818,699 A | * | 10/1998 | Fukuoka ................. | H01L 23/10 257/353 |
| 5,939,817 A | * | 8/1999 | Takado .................. | H03H 9/059 310/313 R |
| 5,949,654 A | * | 9/1999 | Fukuoka ................. | H01L 21/50 257/700 |
| 2001/0027633 A1 | * | 10/2001 | Amako ................... | B65B 51/22 53/478 |

(Continued)

FOREIGN PATENT DOCUMENTS

DE  102007017238 A1 * 10/2008
JP  EP 0098176 A2 *  1/1984 ............. H01L 21/50

(Continued)

*Primary Examiner* — Kiley Stoner
(74) *Attorney, Agent, or Firm* — Harness, Dickey & Pierce, P.L.C.

(57) ABSTRACT

A method for manufacturing an electronic device is provided, in which a base and a lid as a cover body are bonded together while forming an interior space between the base and the lid. The method includes: a step of preparing the lid including a groove communicating the interior space with the outside, the groove being in a back surface of the lid; a step of accommodating a gyro element as an electronic component in the interior space; a first bonding step of bonding the base and the lid together by seam welding at an area for bonding except for a portion corresponding to the groove; and a second bonding step of bonding the base and the lid by welding using a laser beam at a portion of the area for bonding, the portion including an end of the groove on the outside side, to thereby close the groove.

10 Claims, 15 Drawing Sheets

(56) References Cited

U.S. PATENT DOCUMENTS

| | | | | |
|---|---|---|---|---|
| 2003/0142928 A1* | 7/2003 | Hirata | G02B 6/4201 | 385/92 |
| 2005/0238296 A1* | 10/2005 | Oda | B81C 1/00317 | 385/92 |
| 2007/0199925 A1* | 8/2007 | Kigawa | H01L 21/50 | 219/121.64 |
| 2008/0053700 A1* | 3/2008 | O'Connor | B23K 20/122 | 174/564 |
| 2008/0271908 A1* | 11/2008 | Yamamoto | H01L 23/06 | 174/50.5 |
| 2008/0290956 A1* | 11/2008 | Horie | H01L 23/057 | 331/68 |
| 2009/0151972 A1* | 6/2009 | Potter | B81C 1/00269 | 174/50.5 |
| 2011/0027645 A1* | 2/2011 | Komatsuki | H01M 2/08 | 429/185 |
| 2013/0329385 A1* | 12/2013 | Murayama | H05K 7/02 | 361/757 |
| 2014/0084752 A1* | 3/2014 | Miyasaka | G01C 19/5628 | 310/348 |
| 2014/0211384 A1* | 7/2014 | Aoki | G01C 19/5783 | 361/679.01 |
| 2015/0116915 A1* | 4/2015 | Aoki | G01C 19/5769 | 361/679.01 |
| 2015/0116951 A1* | 4/2015 | Kawauchi | B23K 11/06 | 361/728 |
| 2015/0194359 A1* | 7/2015 | Hata | H01L 23/10 | 257/678 |
| 2015/0250386 A1* | 9/2015 | Jose James | A61N 1/375 | 600/407 |

FOREIGN PATENT DOCUMENTS

| | | | | |
|---|---|---|---|---|
| JP | EP 0287722 A1 * | 10/1988 | | B23K 26/206 |
| JP | 01-151813 | 6/1989 | | |
| JP | 2000-223604 A | 8/2000 | | |
| JP | 2002-359311 A | 12/2002 | | |
| JP | 3456432 | 8/2003 | | |

* cited by examiner

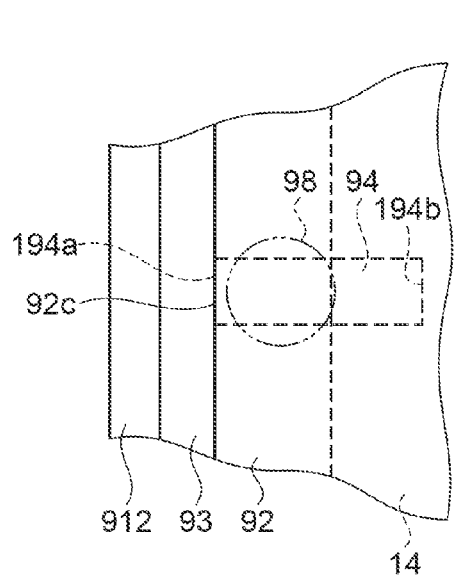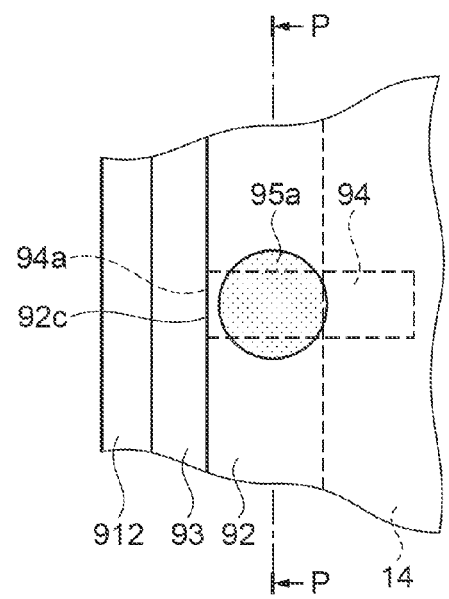
FIG. 7A  FIG. 7C
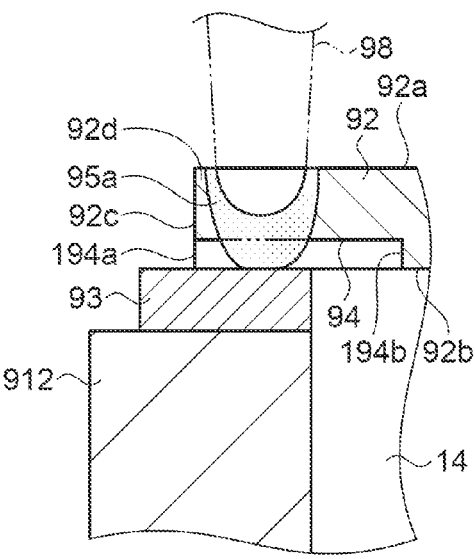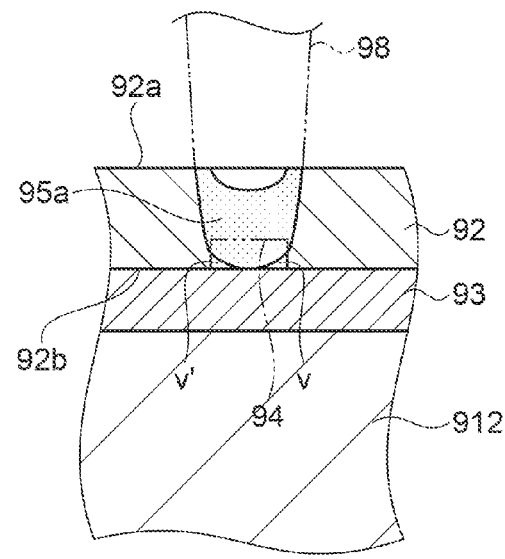
FIG. 7B  FIG. 7D

METHOD FOR MANUFACTURING ELECTRONIC DEVICE, COVER BODY, ELECTRONIC DEVICE, ELECTRONIC APPARATUS, AND MOVING OBJECT

BACKGROUND

1. Technical Field

The present invention relates to a method for manufacturing an electronic device, a cover body, an electronic device, an electronic apparatus, and a moving object.

2. Related Art

In recent years, as mobile electronic apparatuses have become widespread, reductions in size, weight, and cost of the electronic apparatuses are increasingly demanded. Therefore, also for electronic components used in the electronic apparatuses, reductions in size and cost, with maintaining of high accuracy, are increasingly demanded. Especially in a vibrating device having a vibrating element accommodated in a package, since vibration characteristics are maintained by maintaining the hermeticity of a space in which the vibrating element is accommodated, various proposals have been made for the sealing technique of the space.

For example, JP-A-2000-223604 and JP-A-2002-359311 each disclose a bonding method, in which a lid for covering an opening of a space for accommodating a vibrating device element (vibrating element) and the opening edge are welded together leaving a portion of the edge, degassing is performed, and thereafter, the lid and the opening edge at the unwelded portion are sealed together. Moreover, JP-A-1-151813 discloses a small quartz crystal vibrator in which notches are formed in a surface of a package to be bonded with a lid, a metal brazing material at portions other than the notches is melted to bond the lid and the package together leaving a portion of the metal brazing material, and degassing is performed. Thereafter, the metal brazing material at the notch portions is melted again to seal the lid and the package.

However, in the bonding methods shown in JP-A-2000-223604 and JP-A-2002-359311, the lid and the opening edge are welded together while leaving the portion, and the unwelded portion is welded after degassing. Therefore, it is difficult to stably manage the dimension or the like of the unwelded portion. Also, since the degassing is performed through a slight gap of the unwelded portion, the degassing time is lengthened, and the number of sealing steps is increased. In the configuration shown in JP-A-1-151813, since degassing is performed while melting the metal brazing material, the management of the molten state is required. Therefore, degassing and sealing cannot be stably performed, which may cause unstable vibration characteristics.

SUMMARY

An advantage of some aspects of the invention is to solve at least a part of the problems described above, and the invention can be implemented as the following modes or application examples.

Application Example 1

This application example is directed to a method for manufacturing an electronic device, in which a base and a cover body are bonded together while forming an interior space for accommodating an electronic component between the base and the cover body, the method including: a step of preparing the cover body including a groove communicating the interior space with the outside, the groove being in a surface of the cover body on the side to be bonded with the base; a step of accommodating the electronic component in the interior space; a first bonding step of bonding the base and the cover body together by welding at an area for bonding the base and the cover body together except for an unwelded portion including a portion at which the base and the cover body are not welded due to the groove; and a second bonding step of bonding the base and the cover body together by energy beam welding at a portion of the area for bonding, the portion including an end of the groove on the outside side, to thereby close the groove.

According to the method for manufacturing an electronic device, a gap can be formed locally between the base and the cover body after welding (after the first bonding step). Therefore, by closing the gap under reduced pressure or under an inert gas atmosphere in the second bonding step, gas generated in welding in the first bonding step is removed from within a package, so that high-quality hermetic sealing can be realized. Moreover, since a through-hole and a sealing material as used in the related art are not necessary, the manufacturing step is simplified and the package can be reduced in size. Further, since bonding is performed by energy beam welding at the portion including the end of the groove on the outside side, a molten metal melted by an energy beam flows from the end side of the groove at which the molten metal has a small surface tension to the base side. Due to this, the fluidity of the molten metal becomes favorable, so that so-called hermetic sealing, which perfectly closes the gap of the groove, can be reliably performed. Therefore, it is possible to manufacture an electronic device with improved hermetic reliability.

Application Example 2

In the method for manufacturing an electronic device according to the application example described above, it is preferable that the first bonding step is a step of performing the bonding by seam welding.

Due to this, the cover body and the base can be bonded together without closing the groove formed in the bonding surface of the cover body to the base.

Application Example 3

In the method for manufacturing an electronic device according to the application example described above, it is preferable that at least one of the base and the cover body includes a metal layer, the metal layer having a thickness smaller than the depth of the groove, and that in the first bonding step, the metal layer is melted by the seam welding to bond the base and the cover body together.

Due to this, since the volume of the metal layer melted in the first bonding step is smaller than that of the groove, the cover body and the base can be strongly bonded together by seam welding without closing the groove formed in the bonding surface of the cover body to the base.

Application Example 4

In the method for manufacturing an electronic device according to the application example described above, it is preferable that the relation of L1>L2 is satisfied, where L1 is the width of the groove, and L2 is the depth of the groove.

Due to this, it is possible to locally form a gap between the base and the cover body after the first bonding step and simply and reliably close the gap in the second bonding step.

Application Example 5

In the method for manufacturing an electronic device according to the application example described above, it is preferable that the outline of the cover body in plan view is a rectangular shape, and that in the first bonding step, the seam welding is performed along each side of the cover body in plan view.

Due to this, it is possible in the first bonding step to simply and reliably bond the base and the cover body at a main portion of the area for bonding while preventing a portion corresponding to the groove formed in the bonding surface of the cover body to the base from being welded.

Application Example 6

In the method for manufacturing an electronic device according to the application example described above, it is preferable that the groove is disposed at a side portion of the cover body in plan view.

Due to this, it is easy to control the size of the local gap formed between the base and the cover body after seam welding.

Application Example 7

In the method for manufacturing an electronic device according to the application example described above, it is preferable that using a plate-like cover body including a circumferential surface connecting a front surface with a back surface, the base and the cover body are bonded together through the first bonding step.

Due to this, it is possible to easily form the groove in the cover body, so that the processing cost of the cover body can be reduced. Moreover, the package can be reduced in size.

Application Example 8

In the method for manufacturing an electronic device according to the application example described above, it is preferable that the groove has one of ends opened in the circumferential surface of the cover body and the other end disposed at a position facing the interior space, and that the base and the cover body are bonded together through the first bonding step.

As described above, since the groove is disposed in the plate-like cover body, the interior space disposed in the base is communicated with the outside after welding (after the first bonding step). Due to this, it is possible to form a local gap between the base and the cover body. Moreover, since the groove has the other end disposed on the center portion side of the cover body, evacuation can be performed in one direction. That is, sealing is possible by performing welding (welding for closure) at one place in one groove. Then, by closing the gap under reduced pressure or under an inert gas atmosphere in the second bonding step, gas generated in welding is removed from within the package, so that high-quality hermetic sealing can be easily realized. Moreover, since a through-hole and a sealing material as used in the related art are not necessary, the manufacturing step is simplified and the package can be reduced in size.

Application Example 9

In the method for manufacturing an electronic device according to the application example described above, it is preferable that in the second bonding step, the base and the cover body are bonded by energy beam welding at a portion of the area for bonding, the portion including one of ends of the groove on the outside side.

Due to this, a molten metal melted by an energy beam flows from the end side of the groove at which the molten metal has a small surface tension to the base side. Due to this, the fluidity of the molten metal becomes favorable, so that so-called hermetic sealing, which perfectly closes the gap of the groove, can be reliably performed. Therefore, it is possible to manufacture an electronic device with improved hermetic reliability.

Application Example 10

In the method for manufacturing an electronic device according to the application example described above, it is preferable that the method further includes, after the first bonding step, a step of performing evacuation of the interior space through the groove, and that the second bonding step is disposed after the step of performing the evacuation.

Due to this, it is possible to provide a method for manufacturing an electronic component, which can perform, without needing to manage the unwelded portion or the like for disposing an evacuation hole, evacuation of the interior space and sealing (closure of the groove) by a simple method.

Application Example 11

This application example is directed to a cover body including: a first surface and a second surface being in a front-and-back relation to each other; a circumferential surface connecting the first surface with the second surface; a first groove disposed in the first surface from the circumferential surface toward a center portion of the first surface; and a second groove disposed in the second surface from the circumferential surface toward a center portion of the second surface.

According to this application example, the first groove and the second groove of the cover body are disposed from the circumferential surface of the cover body toward the center portion of the cover body. In other words, the first groove and the second groove are disposed in the first surface and the second surface from the circumferential surface of the cover body toward the inside of the cover body. Then, the first groove and the second groove are disposed in the first surface and the second surface of the cover body that are in a front-and-back relation to each other. With these configurations, when the cover body is bonded to a bonding member, the cover body is not bonded at a portion at which the first groove or the second groove is disposed, so that evacuation can be performed through one of the first groove and the second groove that is not bonded. The first groove and the second groove are previously disposed in the cover body, and the first groove and the second groove are used as they are as evacuation holes. Therefore, it becomes unnecessary to perform, for example, dimension management of an unbonded portion (evacuation hole) used for evacuation, as performed in the related art, so that evacuation and bonding can be stably performed. Moreover, the cover body can be placed on the bonding member without distinguishing between the front and back sides.

The "center portion of the cover body" described above means a portion that is located inward from the circumferential surface of the cover body on each of the first surface and the second surface, that is, a portion that is located inside of the circumferential surface on each of the first surface and the second surface of the cover body.

Application Example 12

In the cover body according to the application example described above, it is preferable that the first groove and the second groove are disposed at positions at which the first groove and the second groove at least partially overlap each other in plan view.

According to this application example, the first groove and the second groove are disposed at the positions at which the first groove and the second groove at least partially overlap each other in plan view. Therefore, when the cover body is placed on a bonding member, the position of an evacuation hole can be easily imagined as planarly viewed from above. Due to this, sealing of the evacuation hole can be easily performed.

Application Example 13

In the cover body according to the application example described above, it is preferable that the first groove and the second groove are disposed at different positions in plan view.

According to this application example, since the first groove and the second groove are disposed at the different positions in plan view, the wall thickness of remaining members at the portions at which the first groove and the second groove are disposed can be increased. Due to this, a melting allowance (melt volume) when sealing an evacuation hole can be increased, so that sealing can be performed more stably.

Application Example 14

In the cover body according to the application example described above, it is preferable that the first groove and the second groove are disposed at positions line-symmetrical about one imaginary line passing through a center of the first surface or the second surface and dividing the first surface or the second surface into two portions.

According to this application example, when the cover body is turned upside down, the first groove or the second groove is arranged at the same position. Therefore, sealing can be performed at the same position. Due to this, the efficiency of sealing work can be enhanced.

Application Example 15

In the cover body according to the application example described above, it is preferable that the first groove and the second groove are disposed at positions point-symmetrical about the center of the first surface or the second surface.

According to this application example, when the cover body is turned upside down, the first groove or the second groove is arranged at the same position. Therefore, sealing can be performed at the same position. Due to this, the efficiency of sealing work can be enhanced.

Application Example 16

In the cover body according to the application example described above, it is preferable that when the first groove and the second groove are made into a pair, a plurality of pairs of the first groove and the second groove are disposed.

According to this application example, since a plurality of evacuation holes can be disposed, evacuation ability can be improved, so that the evacuation speed can be increased. Due to this, the efficiency of sealing work can be enhanced.

Application Example 17

This application example is directed to an electronic device including: a package including the cover body according to the application example described above and a base to which the cover body is bonded; and an electronic component accommodated in the package, wherein the first groove or the second groove is sealed by melting.

According to this electronic device, the size can be reduced, and high-quality hermetic sealing can be simply realized.

Application Example 18

This application example is directed to an electronic apparatus including the electronic device according to the application example described above.

According to this electronic apparatus, excellent reliability can be provided.

Application Example 19

This application example is directed to a moving object including the electronic device according to the application example described above.

According to this moving object, excellent reliability can be provided.

BRIEF DESCRIPTION OF THE DRAWINGS

The invention will be described with reference to the accompanying drawings, wherein like numbers reference like elements.

FIGS. 2A and 2B are schematic views showing the vibrator as the first embodiment of the electronic device, in which FIG. 2A is a plan view; and FIG. 2B is a front cross-sectional view.

FIGS. 4A to 4C show an example of a cover body (lid) used in the electronic device, in which FIG. 4A is a plan view; FIG. 4B is a front cross-sectional view; and FIG. 4C is a partial cross-sectional view.

FIGS. 6A to 6D show a sealing step, in which FIG. 6A is a plan view showing a correlation between a groove and an energy beam; FIG. 6B is an elevation view of FIG. 6A; FIG. 6C is a plan view of a sealing portion; and FIG. 6D is a front cross-sectional view of FIG. 6C.

FIGS. 7A to 7D show a comparative example of a sealing step, in which FIG. 7A is a plan view showing a correlation between a groove and an energy beam; FIG. 7B is a front cross-sectional view of FIG. 7A; FIG. 7C is a plan view of a sealing portion; and FIG. 7D is a cross-sectional view taken along line P-P of FIG. 7C.

FIGS. 8A and 8B are schematic views showing a vibrator as a second embodiment of an electronic device, in which FIG. 8A is a plan view; and FIG. 8B is a front cross-sectional view.

FIGS. 9A and 9B show an example of a cover body (lid) according to the invention, in which FIG. 9A is a plan view; and FIG. 9B is a front cross-sectional view.

FIGS. 10A to 10C show modified examples of a cover body (lid), in which FIG. 10A shows Modified Example 1; FIG. 10B shows Modified Example 2; and FIG. 10C shows Modified Example 3.

FIGS. 11A to 11C show modified examples of a cover body (lid), in which FIG. 11A shows Modified Example 4; FIG. 11B shows Modified Example 5; and FIG. 11C shows Modified Example 6.

DESCRIPTION OF EXEMPLARY EMBODIMENTS

Hereinafter, an electronic device, a method for manufacturing an electronic device, a cover body used in the electronic devices, and an electronic apparatus and a moving object using an electronic device according to the invention will be described in detail in accordance with the accompanying drawings.

First Embodiment of Electronic Device

First, as a first embodiment of an electronic device manufactured by applying the method for manufacturing an electronic device according to the invention, an embodiment of a vibrator will be described.

Figure 1:
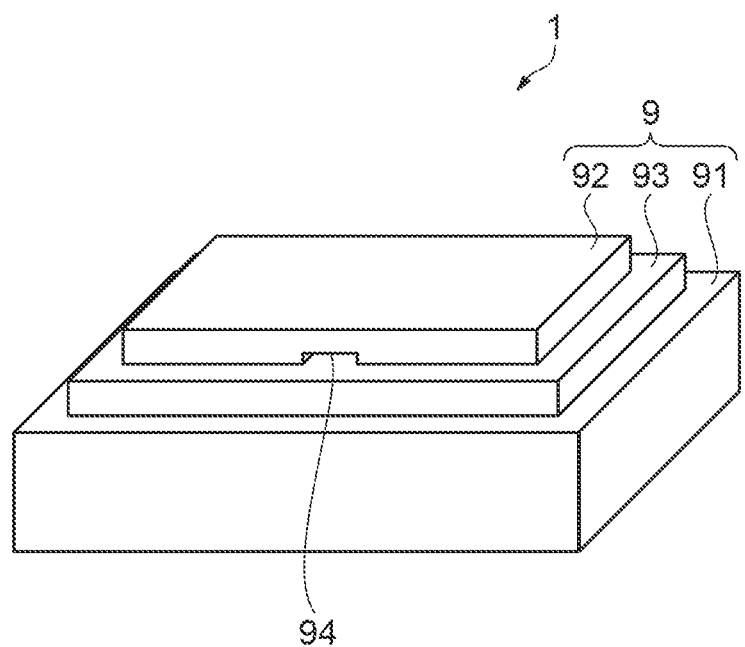
FIG. 1 is a perspective view schematically showing a vibrator as a first embodiment of an electronic device.
Figure 2A:
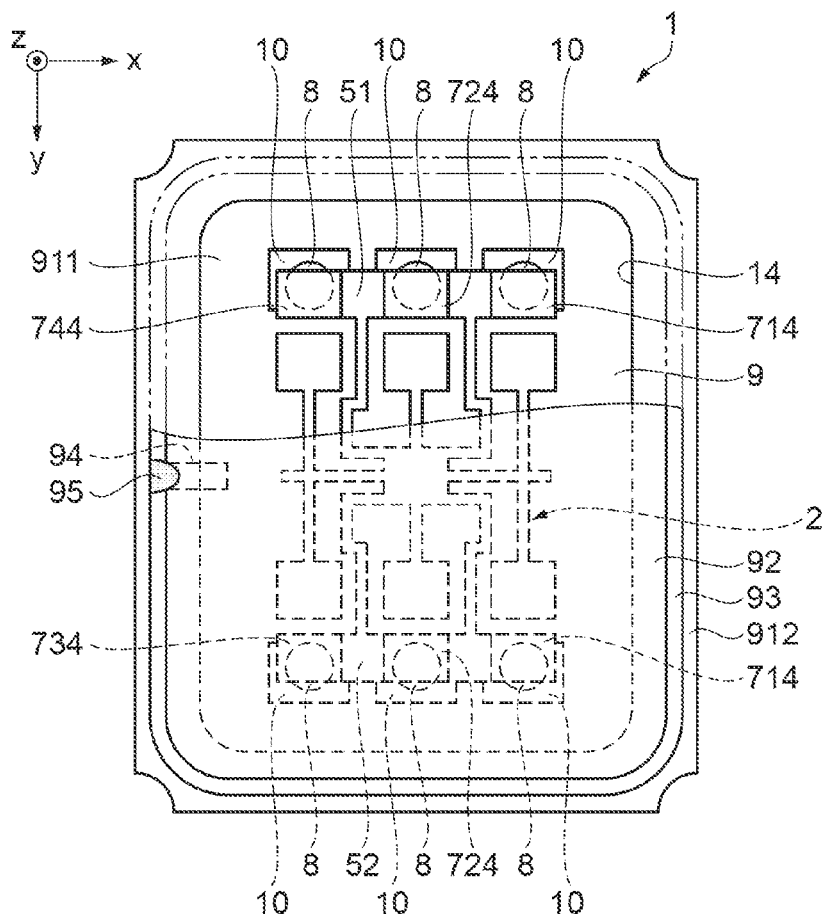
Figure 2B:
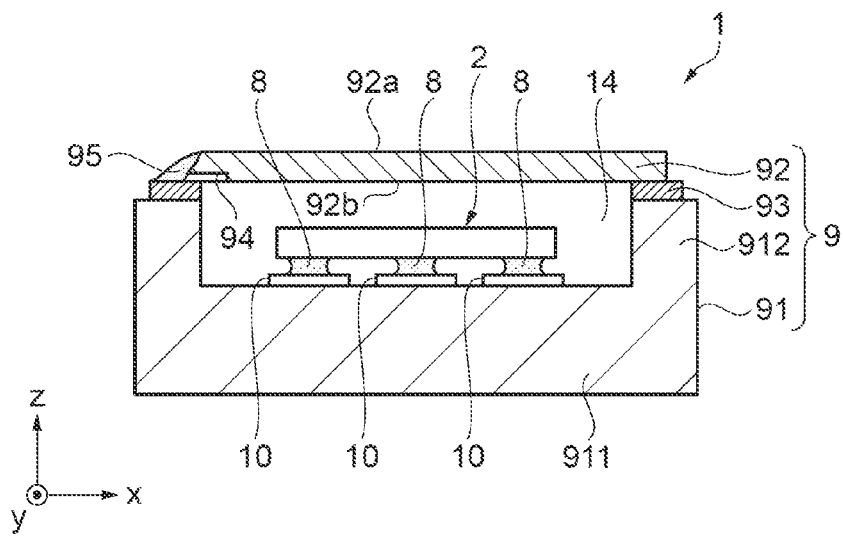
Figure 3:
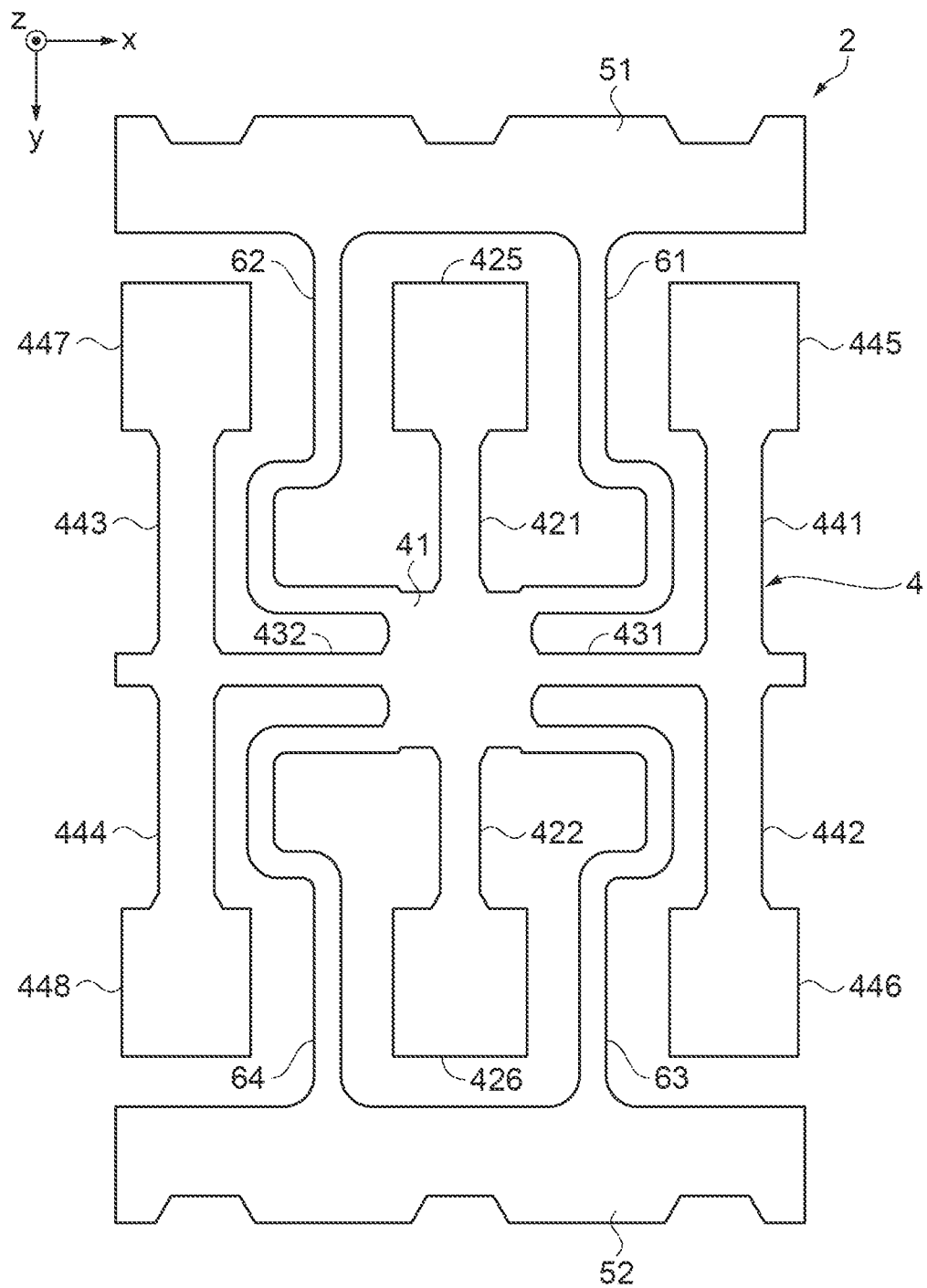
FIG. 3 is a plan view showing a gyro element as an electronic component used in the electronic device.

FIG. 1 is a schematic perspective view showing the vibrator as the first embodiment of the electronic device according to the invention. FIGS. 2A and 2B schematically show the vibrator as the first embodiment of the electronic device according to the invention, in which FIG. 2A is a plan view; and FIG. 2B is a front cross-sectional view. FIG. 3 is a plan view showing a gyro element as an electronic component included in the vibrator shown in FIGS. 2A and 2B. In the following as shown in FIGS. 2A and 2B, three axes orthogonal to each other are defined as an x-axis, a y-axis, and a z-axis. The z-axis coincides with a thickness direction of the vibrator. Moreover, a direction parallel to the x-axis referred to as "x-axis direction" (second direction)"; a direction parallel to the y-axis referred to as "y-axis direction (first direction)"; and a direction parallel to the z-axis referred to as "z-axis direction".

The vibrator 1 shown in FIGS. 1 to 2B as an example of an electronic device includes a gyro element (vibrating element) 2 as an electronic component and a package 9 for accommodating the gyro element 2. Hereinafter, the gyro element 2 and the package 9 will be sequentially described in detail. In the package 9 shown in FIG. 1, a base 91, a seam ring 93, and a lid 92 as a cover body are included. In the drawing, the groove 94 disposed in the lid 92 is shown, where later-described sealing (second bonding step) is not performed on the groove.

Gyro Element

FIG. 3 is a plan view of the gyro element as viewed from above (the lid 92 side, described later, and the z-axis direction in FIGS. 2A and 2B). In the gyro element, detection signal electrodes, detection signal wires, detection signal terminals, detection ground electrodes, detection ground wires, detection ground terminals, drive signal electrodes, drive signal wires, drive signal terminals, drive ground electrodes, drive ground wires, drive ground terminals, and the like are disposed. However, these members are omitted in the drawing.

The gyro element 2 is an "antiplane detection type" sensor that detects an angular velocity about the z-axis. Although not shown in the drawing, the gyro element 2 is composed of a base material, and electrodes, wires, and terminals disposed on a surface of the base material. The gyro element 2 can be composed of a piezoelectric material such as quartz crystal, lithium tantalate, or lithium niobate. However, quartz crystal is preferable among them. Due to this, it is possible to obtain the gyro element 2 capable of exhibiting excellent vibration characteristics (frequency characteristics).

The gyro element 2 includes a so-called double T-type vibrating body 4, a first support portion 51 and a second support portion 52 as support portions supporting the vibrating body 4, and a first beam 61, a second beam 62, a third beam 63, and a fourth beam 64 as beams coupling the vibrating body 4 with the first and second support portions 51 and 52.

The vibrating body 4 expands in an xy plane and has a thickness in the z-axis direction. The vibrating body 4 includes: a base portion 41 located at the center; a first detection vibrating arm 421 and a second detection vibrating arm 422 extending in opposite directions from the base portion 41 along the y-axis direction; a first coupling arm 431 and a second coupling arm 432 extending in opposite directions from the base portion 41 along the x-axis direction; a first drive vibrating arm 441 and a second drive vibrating arm 442 as vibrating arms extending in opposite directions from a tip portion of the first coupling arm 431 along the y-axis direction; and a third drive vibrating arm 443 and a fourth drive vibrating arm 444 as vibrating arms extending in opposite directions from a tip portion of the second coupling arm 432 along the y-axis direction. At tip portions of the first and second detection vibrating arms 421 and 422 and the first, second, third, and fourth drive vibrating arms 441, 442, 443, and 444, weight portions (hammerheads) 425, 426, 445, 446, 447, and 448 as substantially quadrilateral wide portions having a larger width than that on the based end side are respectively disposed. By disposing the weight portions 425, 426, 445, 446, 447, and 448, detection sensitivity of the gyro element 2 for angular velocity is improved.

The first and second support portions 51 and 52 extend along the x-axis direction. Between the first and second support portions 51 and 52, the vibrating body 4 is located. In other words, the first and second support portions 51 and 52 are arranged so as to face each other along the y-axis direction with the vibrating body 4 located therebetween. The first support portion 51 is coupled with the base portion 41 through the first beam 61 and the second beam 62, while the second support portion 52 is coupled with the base portion 41 through the third beam 63 and the fourth beam 64.

The first beam 61 passes between the first detection vibrating arm 421 and the first drive vibrating arm 441 to couple the first support portion 51 with the base portion 41. The second beam 62 passes between the first detection vibrating arm 421 and the third drive vibrating arm 443 to couple the first support portion 51 with the base portion 41. The third beam 63 passes between the second detection vibrating arm 422 and the second drive vibrating arm 442 to couple the second support portion 52 with the base portion 41. The fourth beam 64 passes between the second detection vibrating arm 422 and the fourth drive vibrating arm 444 to couple the second support portion 52 with the base portion 41.

Each of the beams 61, 62, 63, and 64 is formed in an elongated shape with a serpentine portion extending along the y-axis direction while reciprocating along the x-axis direction, and therefore has elasticity in all directions. Therefore, even when an impact is applied from the outside, detection noises caused by this impact can be reduced or suppressed because each of the beams 61, 62, 63, and 64 has a function of absorbing the impact.

The gyro element 2 having this configuration detects an angular velocity ω about the z-axis as follows. In the gyro element 2, when an electric field is generated between the drive signal electrode (not shown) and the drive ground electrode (not shown) in a state where the angular velocity ω is not applied, the drive vibrating arms 441, 442, 443, and 444 perform bending vibration in the x-axis direction. In this case, since the first and second drive vibrating arms 441 and 442 and the third and fourth drive vibrating arms 443 and 444 vibrate plane-symmetrically about a yz plane passing through a center point (center of gravity), the base portion 41, the first and second coupling arms 431 and 432, and the first and second detection vibrating arms 421 and 422 do not hardly vibrate.

In a state of performing this driving vibration, when the angular velocity ω about the z-axis is applied to the gyro element 2, the Coriolis force in the y-axis direction acts on the drive vibrating arms 441, 442, 443, and 444 and the coupling arms 431 and 432, and in response to vibrations in the y-axis direction, detection vibrations in the x-axis direction are excited. Then, the strain of the detection vibrating arms 421 and 422 caused by the vibrations is detected by the detection signal electrode (not shown) and the detection ground electrode (not shown) to obtain the angular velocity ω.

Package

The package 9 accommodates the gyro element 2. In the package 9, an IC chip or the like that performs the driving or the like of the gyro element 2 may be accommodated, in addition to the gyro element 2, as in an electronic device described later. The package 9 has, in its plan view (xy plane view), a substantially rectangular shape.

As shown in FIGS. 1 to 2B, the package 9 includes the base 91 having a recess that is opened in an upper surface, and the lid 92 as a cover body bonded to the base via the seam ring 93 so as to close an opening of the recess. The base 91 has a plate-like bottom plate 911 and a frame-like side wall 912 disposed at an circumferential edge of the upper surface of the bottom plate 911. The frame-like side wall 912 is formed in a substantially rectangular circumferential shape. In other words, the shape of the opening that is opened in the upper surface of the recess is a substantially rectangular shape. The recess surrounded by the plate-like bottom plate 911 and the frame-like side wall 912 serves as an interior space 14 for accommodating the gyro element 2 as an electronic component. On an upper surface of the frame-like side wall 912, the seam ring 93 formed of an alloy such as, for example, Kovar is disposed. The seam ring 93 has a function as a bonding material between the lid 92 and the side wall 912, and is disposed in a frame shape (substantially rectangular circumferential shape) along the upper surface of the side wall 912. The lid 92 has a substantially rectangular outer shape. In a back surface 92b of the lid 92, the groove 94 with a bottom is disposed from the circumference toward the center portion. The configuration of the lid 92 will be described in detail later.

The groove 94 is arranged such that when the lid 92 is placed on the seam ring 93, the groove 94 reaches the interior space 14. The package 9 includes the interior space 14 therein, and within the interior space 14, the gyro element 2 is hermetically accommodated and installed. The interior space 14 in which the gyro element 2 is accommodated is sealed (closed) by a sealing portion 95. The sealing portion 95 is formed as follows: after performing evacuation (degassing) through the groove 94, the lid 92 left at a portion at which the groove 94 is formed is melted by an energy beam (for example, a laser beam) and then solidified, that is, the sealing portion 95 is formed by energy beam welding. The sealing portion 95 is formed by melting and solidifying an end of the groove 94 on the outside side, that is, a portion including the circumferential surface 92c of the lid 92.

The constituent material of the base 91 is not particularly limited, and various kinds of ceramics such as aluminum oxide can be used. The constituent material of the lid 92 is not particularly limited, but is desirably a member having a linear expansion coefficient close to that of the constituent material of the base 91. For example, when the ceramics described above are used as the constituent material of the base 91, an alloy such as Kovar is preferably used.

The gyro element 2 is fixed, at the first and second support portions 51 and 52, to the upper surface of the bottom plate 911 via conductive fixing members 8 such as solder, silver paste, or a conductive adhesive (adhesive having a conductive filler, such as metal particles, dispersed in a resin material). The first and second support portions 51 and 52 are located at both end portions of the gyro element 2 in the y-axis direction. Therefore, by fixing the first and second support portions 51 and 52 to the bottom plate 911, the vibrating body 4 of the gyro element 2 is supported at both ends, so that the gyro element 2 can be fixed stably to the bottom plate 911. Therefore, unwanted vibrations (vibrations other than a detection vibration) of the gyro element 2 are suppressed, so that detection accuracy for the angular velocity ω by the gyro element 2 is improved.

Six conductive fixing members 8 are disposed spaced apart from each other and correspond to (contact) two detection signal terminals 714, two detection ground terminals 724, a drive signal terminal 734, and a drive ground terminal 744, all of which are disposed at the first and second support portions 51 and 52. On the upper surface of the bottom plate 911, six connection pads 10 corresponding to the two detection signal terminals 714, the two detection ground terminals 724, the drive signal terminal 734, and the drive ground terminal 744 are disposed. Each of the connection pads 10 and any of the terminals corresponding thereto are electrically connected via the conductive fixing member 8.

Lid as Cover Body

Figure 4A:
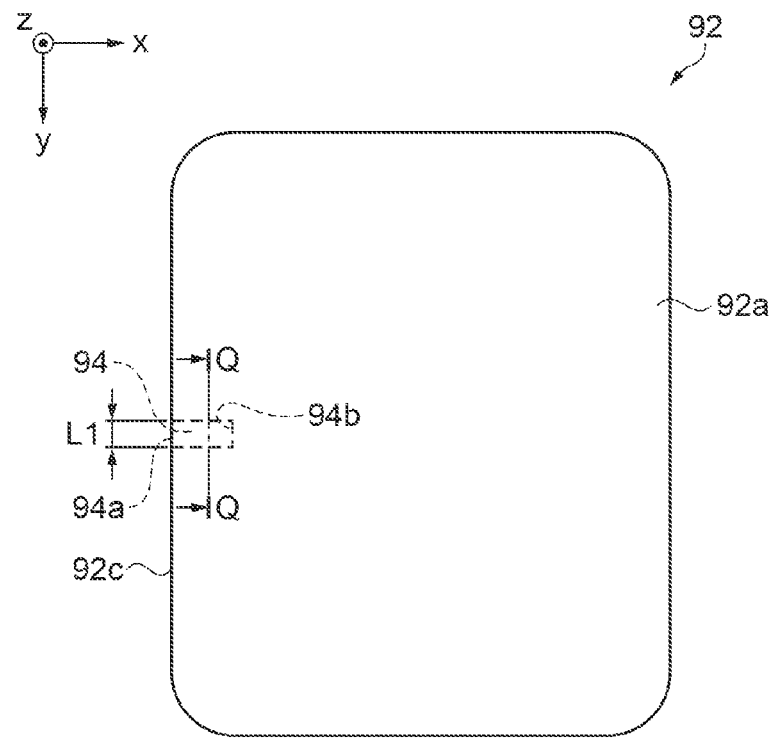
Figure 4B:
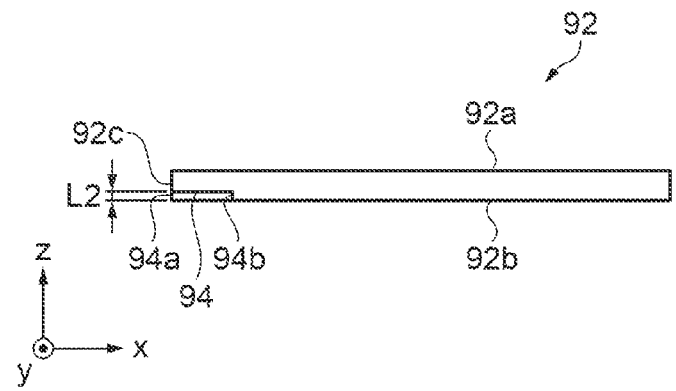
Figure 4C:
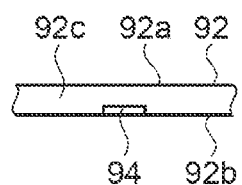

The lid 92 as a cover body will be described with reference to FIGS. 4A to 4C. FIGS. 4A to 4C show an example of a lid as a cover body according to the invention, in which FIG. 4A is a plan view; FIG. 4B is a front cross-sectional view; and FIG. 4C is a cross-sectional view taken along line Q-Q of FIG. 4A.

The lid 92 as a cover body closes the opening of the recess that is opened in the upper surface of the package 9, and is bonded around the opening of the recess using, for example, a seam welding method or the like. Specifically speaking, the lid 92 is a plate-like member including a front surface 92a and the back surface 92b that are in a front-and-back relation to each other, and the circumferential surface 92c connecting the front surface 92a with the back surface 92b. The lid 92 of this example is plate-like, and therefore is easily formed and excellent in shape stability. Especially, although the groove

94 described later is a extremely small groove, the formation of the groove can also be easily performed. Moreover, for the lid 92 of this example, a Kovar plate is used. By using a Kovar plate for the lid 92, the seam ring 93 and the lid 92 that are formed of Kovar are melted in the same molten state in sealing, and they are also easily alloyed. Therefore, sealing can be easily and reliably performed. For the lid 92, a plate of another material may be used instead of Kovar. For example, a metal material such as 42 alloy or stainless steel, or the same material as that of the side wall 912 of the package 9 can be used.

When the lid 92 is planarly viewed from the front surface 92*a* side, the bottomed groove 94 is disposed on the back surface 92*b* side from one side portion of the circumferential surface 92*c* toward the center portion of the lid 92. The groove 94 is located at the substantially center of the one side portion in plan view. The groove 94 is disposed from the circumferential surface 92*c* toward the center portion of the lid 92 so as to have a portion overlapping the opening of the recess that is opened in the upper surface of the package 9 when the lid 92 is placed so as to close the opening of the recess. In other words, the groove 94 has one end 194*a* that is opened in the circumferential surface 92*c*, and the other end 194*b* on the center portion side. The other end 194*b* on the center portion side is disposed so as to reach the inside (center side of the package in plan view) of an inner wall of the frame-like side wall 912 disposed at the circumferential edge of the upper surface of the bottom plate 911 constituting the base 91. By disposing the groove 94 as described above, evacuation of the interior space 14 of the package 9 can be performed. Moreover, since the groove 94 is disposed with the other end 194*b* on the center portion side of the lid 92, evacuation can be performed in one direction. That is, sealing is possible by performing welding (welding for closure) at one place in one groove. The embodiment has been described using an example in which the groove 94 is located at the substantially center of one side portion in plan view. However, the invention is not limited to this. It is sufficient that the groove 94 is disposed at any position of at least one side portion.

It is preferable that the groove 94 satisfies the relation of L1>L2, where L1 is the width of the groove 94 and L2 is the depth of the groove 94. Due to this, after a first bonding step described later, a local gap is formed between the base 91 and the lid 92, and the gap can be simply and reliably closed in a second bonding step described later. The ratio L2/L1 of the width L1 to the depth L2 of the groove 94 is not particularly limited, but is preferably, for example, from 0.1 to 0.5. The width L1 of the groove 94 is not particularly limited, but is preferably about from 1 μm to 200 μm. The depth L2 of the groove 94 is not particularly limited, but is preferably about from 5 μm to 30 μm.

In some cases, a metal layer (not shown) capable of being melted by seam welding is formed on each of the base 91 and the lid 92 at the bonding portion of the base 91 and the lid 92, and thereafter, seam welding is performed. In this case, the depth (the depth L2) of the groove 94 is preferably larger than a sum of the thicknesses of the two metal layers (the metal layer disposed on the base 91 and the metal layer disposed on the lid 92). Due to this, in the first bonding step described later, the lid 92 and the base 91 can be strongly bonded together by seam welding without closing the groove 94 formed in the bonding surface of the lid 92 to the base 91.

Then, evacuation of the interior space 14 is performed through the gap formed due to the groove 94 between the package 9 and the lid 92, and thereafter, the lid 92 at a portion at which the groove 94 is disposed is melted by a laser beam or the like to close the groove 94, so that the interior space 14 is hermetically sealed.

The embodiment has been described using an example in which one groove 94 is disposed in the lid 92. However, the number and arrangement of grooves is not limited to this. A plurality of grooves may be used. Further, the groove may be disposed in the front surface 92*a* and the back surface 92*b* of the lid 92.

The transverse cross-sectional shape of a wall surface of the groove 94 may be any shape such as a rectangular shape, a curved shape, a semicircle shape, or a tapered shape (wedge shape) as long as the groove 94 has a function as an evacuation hole.

Method for Manufacturing Vibrator

Figure 5A:
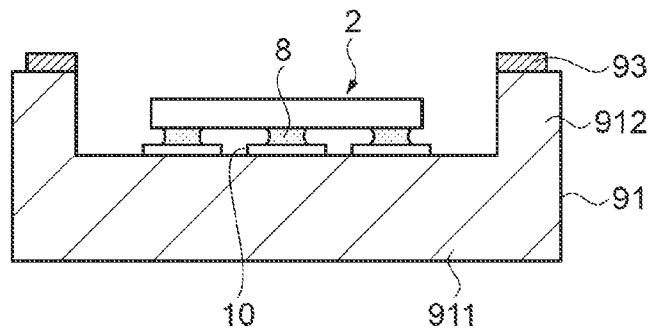
FIGS. 5A to 5D are front cross-sectional views schematically showing manufacturing steps of the vibrator as the electronic device.
Figure 5B:
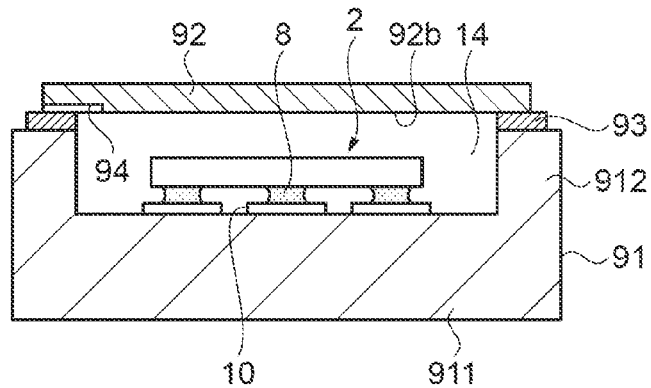
Figure 5C:
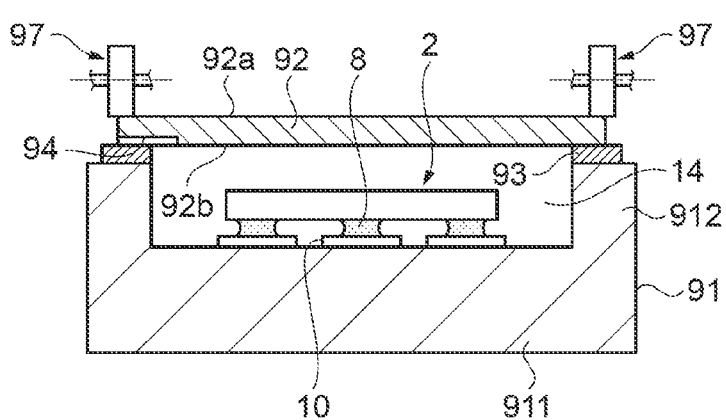
Figure 5D:
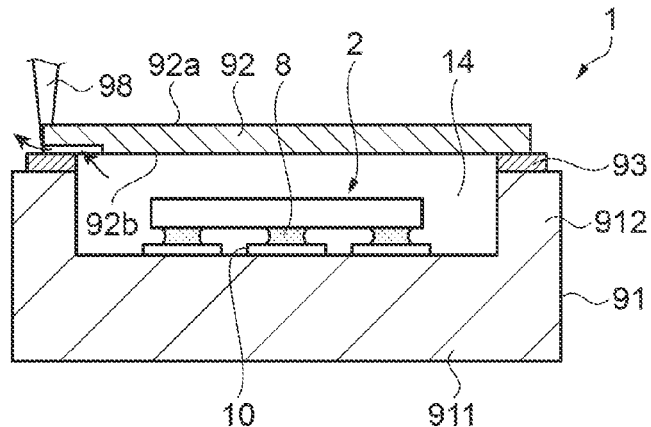
Figure 6A:
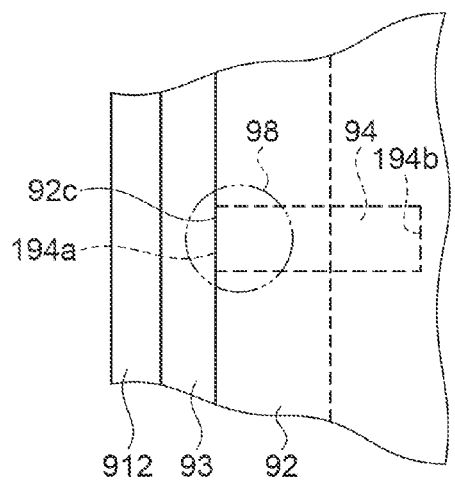
Figure 6C:
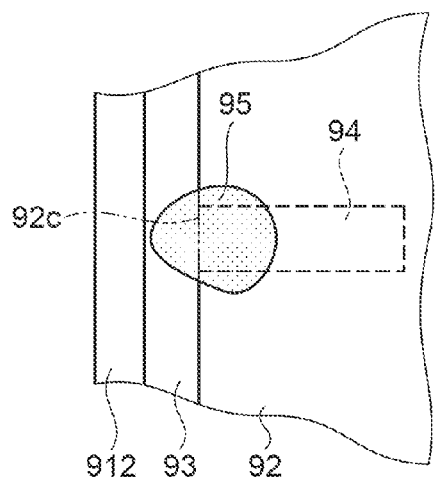
Figure 6B:
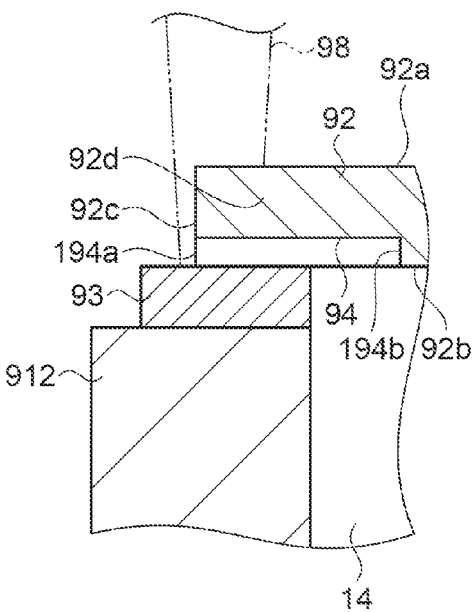
Figure 6D:
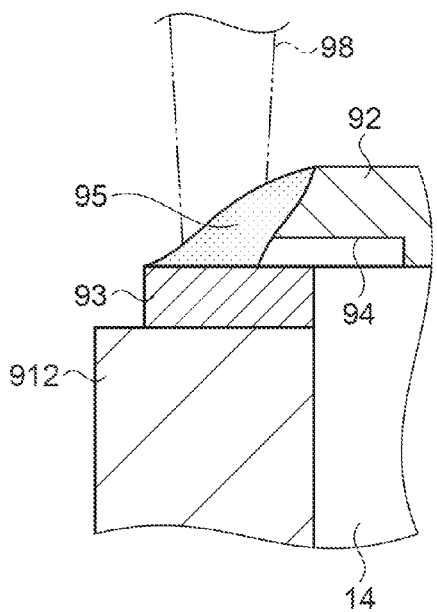

Next, a method for manufacturing the vibrator as an electronic device according to the invention will be described with reference to FIGS. 5A to 7D. FIGS. 5A to 5D are front cross-sectional views schematically showing manufacturing steps of the above-described vibrator as an electronic device shown in FIGS. 1 to 2B. FIGS. 6A to 6D show a sealing step as the second bonding step, in which FIG. 6A is a plan view showing a correlation between a groove and an energy beam (laser beam); FIG. 6B is a front cross-sectional view of FIG. 6A; FIG. 6C is a plan view of a sealing portion; and FIG. 6D is a front cross-sectional view of FIG. 6C. FIGS. 7A to 7D shows a comparative example of a sealing step, in which FIG. 7A is a plan view showing a correlation between a groove and an energy beam (laser beam); FIG. 7B is a front cross-sectional view of FIG. 7A; FIG. 7C is a plan view of a sealing portion; and FIG. 7D is a cross-sectional view taken along line P-P of FIG. 7C.

First, in a step of preparing a lid as a cover body, the lid 92 having the configuration described above is prepared.

Next, a step of accommodating the gyro element 2 as an electronic component in the interior space 14 of the base 91 will be described. As shown in FIG. 5A, the base 91 including the plate-like bottom plate 911, the frame-like side wall 912 disposed at the circumferential edge of the upper surface of the bottom plate 911, and the recess that is surrounded by inner walls of the bottom plate 911 and the side wall 912 and opened in the upper surface is prepared. The recess becomes the interior space 14 when the lid 92 is bonded to the base 91 in the first bonding step described later. In the description of the first embodiment, the space of the base 91 is referred to as "recess" in a state before the first bonding step, while the space is referred to as "interior space 14" in a state after the lid 92 is bonded to the base 91. In the base 91, the seam ring 93 is formed on the upper surface of the frame-like side wall 912, and the connection pads 10 are formed on the upper surface of the bottom plate 911. The gyro element 2 described above is prepared. Then, the connection pads 10 and the gyro element 2 are fixed to each other while making an electrical connection therebetween. For this connection, the conductive fixing member 8 such as solder, silver paste, a conductive adhesive (adhesive having a conductive filler, such as metal particles, dispersed in a resin material) can be used. In this case, the gyro element 2 has a gap relative to the upper surface of the bottom plate 911 due to the thickness of the conductive fixing member 8.

Next, a step of placing the lid 92 over the recess will be described. As shown in FIG. 5B, for hermetically holding the gyro element 2 accommodated in the recess, the lid 92 as a cover body is placed on the seam ring 93. The groove 94 is disposed in the back surface 92*b* of the lid 92. The groove 94 is extended so as to reach the recess when the lid 92 is placed on the seam ring 93. That is, between the lid 92 and the seam ring 93 after the step of placing the lid 92, a gap communicating the recess (the interior space 14) with the outside of the base 91 is formed due to the groove 94.

Next, the first bonding step of bonding the lid 92 to the base 91 will be described. As shown in FIG. 5C, seam welding is performed, using roller electrodes 97 of a seam welding machine, in a rectangular circumferential shape at a portion at which the lid 92 and the seam ring 93 face each other on the frame-like side wall 912, to thereby bond the lid 92 and the seam ring 93 together. That is, the lid 92 is bonded to the base 91. The roller electrodes 97 are caused by a pressurizing mechanism (not shown) to contact the lid 92 with pressure from the side opposite to the base 91. Then, the roller electrodes 97 travel along a circumferential side of the lid 92 in plan view at a predetermined speed while rotating about the axis. In this case, by flowing electric current between the roller electrodes 97 via the lid 92 and the seam ring 93, the seam ring 93 or a bonding metal is melted by Joule heat to thereby bond the lid 92 and the seam ring 93 together. Due to this, the interior space 14 is formed.

In this case, since the lid 92 and the seam ring 93 are not in contact with each other due to the groove 94, the lid 92 at the portion at which the groove 94 is disposed is not seam welded and therefore is in an unwelded state. That is, in the first bonding step, an area for bonding the base 91 and the lid 92 together, except for an area corresponding to the groove 94, is bonded by seam welding. In other words, in the first bonding step, the base 91 and the lid 92 are bonded together by seam welding at the area for bonding, except for an unwelded portion including the area that is not welded due to the groove 94. Since the groove 94 communicates the interior space 14 with the outside of the base 91, this unwelded space functions as an evacuation hole in the next sealing step.

Next, a step of performing evacuation of the interior space 14 using the groove 94 (evacuation hole) will be described. In this example as shown in FIG. 5D, the groove 94 that is not welded in the seam welding described above is extended so as to reach the interior space 14. Hence, with the use of the groove 94 as an evacuation hole, gas in the interior space 14 can be evacuated as indicated by arrows shown in the drawing. The embodiment has been described using an example in which sealing is performed in a state where the gas in the interior space is evacuated, that is, so-called under reduced pressure. However, the invention is not limited to the sealing under reduced pressure. It is also possible to perform sealing under an inert gas atmosphere established by introducing an inert gas or the like after evacuation.

Next, the second bonding step of hermetically sealing the interior space 14 whose evacuation is completed will be described with reference to FIGS. 6A to 7D. As shown in FIGS. 6A and 6B, in a state where the evacuation of the interior space 14 is completed, an energy beam (for example, a laser beam or an electron beam) is emitted on the portion corresponding to the groove 94 used as an evacuation hole. In the embodiment, a laser beam 98 is emitted as an energy beam to melt a metal (Kovar) at the left portion. In this case, the laser beam 98 is emitted such that the end of the groove 94 on the outer side is arranged within a spot of the laser beam 98, that is, the end portion of the groove 94 including the circumferential surface 92c of the lid 92 is arranged so as to be included in the spot. Then, as shown in FIGS. 6C and 6D, a groove top portion 92d of the lid 92 on the front surface 92a side at the portion at which the groove 94 is disposed is melted by heat energy due to the emission of the laser beam 98, and the molten metal flows onto the seam ring 93 while filling the groove 94. After the molten metal sufficiently flows, the emission of the laser beam 98 is stopped. Then, the molten metal is solidified, and the solidified molten metal serves as the sealing portion 95 to close the groove 94, so that the interior space 14 is hermetically sealed.

As described above, the laser beam 98 is emitted such that the end of the groove 94 on the outside side is arranged within the spot of the laser beam 98, that is, the end portion of the groove 94 including the circumferential surface 92c of the lid 92 is arranged so as to be included in the spot. Then, the groove top portion 92d of the lid including the end of the groove 94 is melted. Therefore, the fluidity of the molten metal becomes favorable. Since the fluidity of the molten metal is improved as described above, the sealing of the groove 94 can be reliably performed. This will be further described using a comparative example shown in FIGS. 7A to 7D.

In the comparative example shown in FIGS. 7A to 7D, the spot of the laser beam 98 is located inside of the end of the groove 94 on the outside side as shown in FIGS. 7A and 7B. That is, the laser beam 98 is emitted on the lid 92 at a position not including the circumferential surface 92c of the lid 92. For this reason, as shown in FIGS. 7C and 7D, the lid 92 is melted leaving the circumferential surface 92c of the lid 92. Hence, the surface tension of the molten metal is balanced because the back surface 92b of the lid 92 is present at the circumference. Therefore, the molten metal is unlikely to flow to the seam ring 93 located below the molten metal. For this reason, as shown in FIG. 7D, the molten metal does not flow enough to fill corner portions v and v' on both sides of the groove 94, but is solidified to form the sealing portion 95a, which may result in poor hermeticity.

In contrast to this, in the embodiment shown in FIGS. 6A to 6D, the laser beam 98 is emitted so as to include the end portion of the groove 94 including the circumferential surface 92c of the lid 92. Therefore, because of the absence of a surface on the end side, the surface tension cannot be balanced, that is, the balance is not good, which facilitates the flow of the molten metal to the end side on which the surface tension is weak.

With the use of the manufacturing method including these steps and for the vibrator 1 as an electronic device, the fluidity of the molten metal melted by the laser beam 98 becomes favorable, so that the formation of the sealing portion 95 can be reliably performed. Hence, the sealing of the groove 94 can be reliably performed, so that it is possible to manufacture the vibrator 1 as an electronic device with improved hermetic reliability. Moreover, since the groove 94 is used as it is as an evacuation hole, it becomes unnecessary to perform, for example, dimension management of an unbonded portion (evacuation hole) used for evacuation, as performed in the related art. Therefore, since evacuation and bonding (sealing) are stably performed, even when the vibrator 1 is heated at a high temperature after bonding (sealing), gas to be generated can be suppressed. Moreover, with the stable evacuation and bonding (sealing), it is possible to prevent the characteristic deterioration of the gyro element 2 as an electronic component accommodated in the package 9 due to an influence of a residual gas or the like, so that the vibrator 1 as an electronic device having stable characteristics can be provided.

In the above description, the embodiment has been described using an example in which one evacuation hole (the groove 94) is used. However, a plurality of evacuation holes may be used. When the plurality of evacuation holes are used, the evacuation speed is increased, but a plurality of sealing places are required.

Second Embodiment of Electronic Device

Figure 8A:
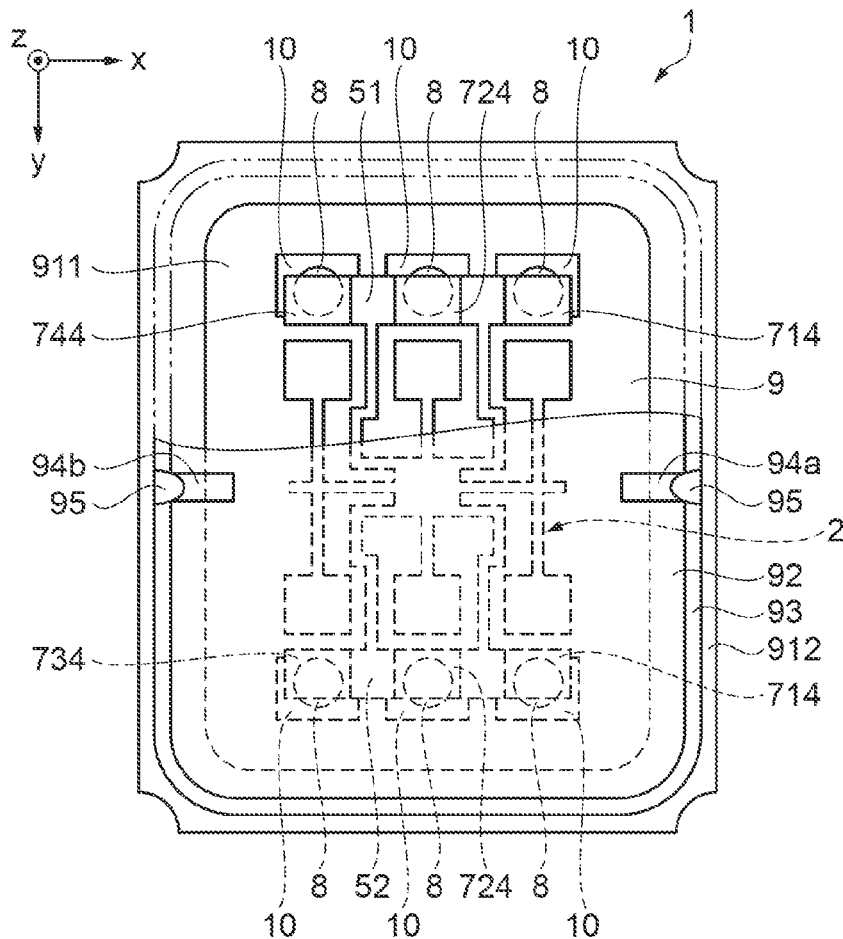
Figure 8B:
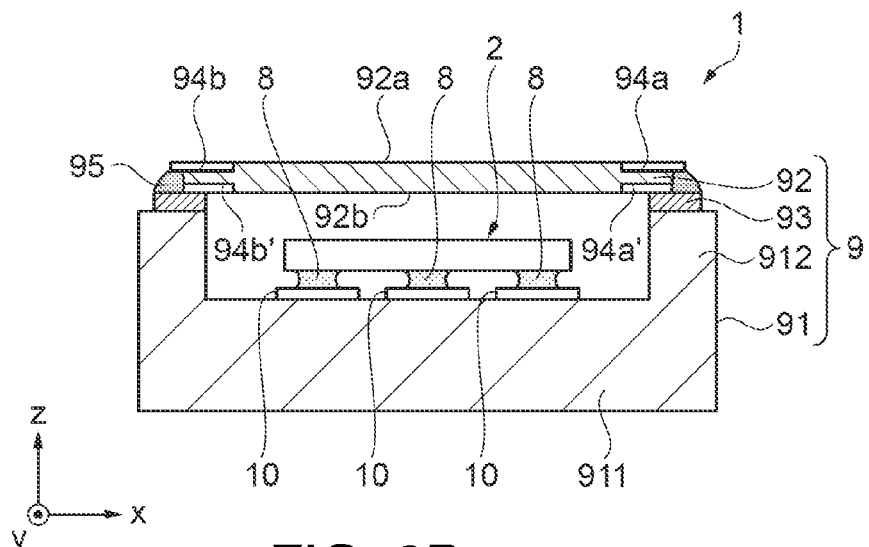

Next, as a second embodiment of an electronic device manufactured by applying a cover body according to the invention, an embodiment of a vibrator will be described. In the second embodiment, configurations similar to those of the first embodiment are denoted by the same reference numerals and signs, and the description thereof is omitted in some cases. FIGS. 8A and 8B schematically show the vibrator as an electronic device using a cover body according to the invention, in which FIG. 8A is a plan view; and FIG. 8B is a front cross-sectional view.

The vibrator 1 as an example of an electronic device shown in FIGS. 8A and 8B includes the gyro element (vibrating element) 2 as an element and the package 9 for accommodating the gyro element 2. Hereinafter, the gyro element 2 and the package 9 will be sequentially described in detail.

Gyro Element

The gyro element 2 used in the second embodiment has a configuration similar to that of the first embodiment, and therefore, the description thereof is omitted.

Package

The package 9 accommodates the gyro element 2. In the package 9, an IC chip or the like that performs the driving or the like of the gyro element 2 may be accommodated, in addition to the gyro element 2, as in an electronic device described later. The package 9 has, in its plan view (xy plane view), a substantially rectangular shape.

As shown in FIGS. 8A and 8B, the package 9 includes the base 91 having the recess that is opened in the upper surface, and the lid 92 as a cover body bonded to the base via the seam ring 93 so as to close the opening of the recess. The base 91 has a configuration similar to that of the first embodiment, and therefore, the description thereof is omitted. The lid 92, which differs from that of the first embodiment in configuration, will be described.

Lid as Cover Body

Figure 9A:
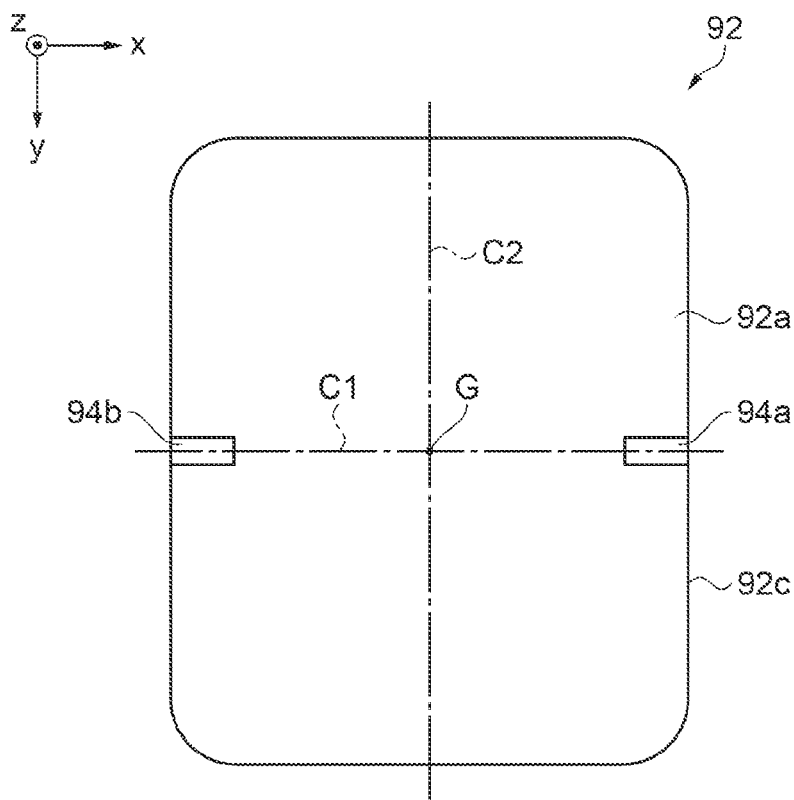
Figure 9B:
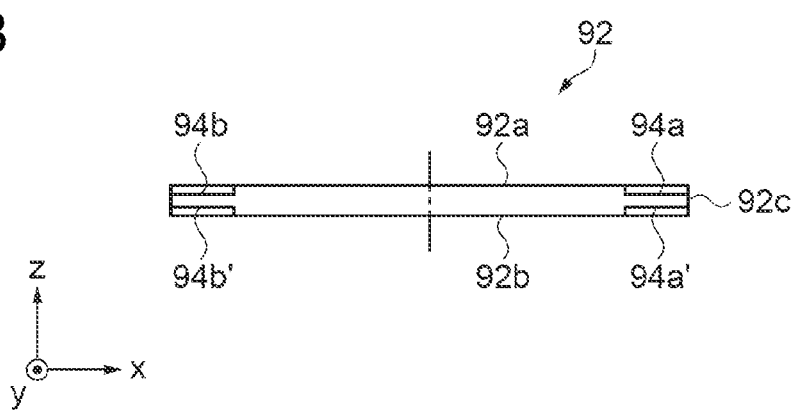

The lid 92 as a cover body will be described with reference to FIGS. 9A and 9B. FIGS. 9A and 9B show an example of a lid as a cover body according to the invention, in which FIG. 9A is a plan view; and FIG. 9B is a front cross-sectional view.

The lid 92 as a cover body closes the opening of the recess that is opened in the upper surface of the package 9, and is bonded around the opening of the recess using, for example, a seam welding method or the like. Specifically speaking, the lid 92 is a plate-like member including a first surface 92a and a second surface 92b that are in a front-and-back relation to each other, and the circumferential surface 92c connecting the first surface 92a with the second surface 92b. For the lid 92 of this example, a Kovar plate is used. By using a Kovar plate for the lid 92, the seam ring 93 and the lid 92 that are formed of Kovar are melted in the same molten state in sealing, and they are also easily alloyed. Therefore, sealing can be easily and reliably performed. For the lid 92, a plate of another material may be used instead of Kovar. For example, a metal material such as 42 alloy or stainless steel, or the same material as that of the side wall 912 of the package 9 can be used.

When the lid 92 is planarly viewed from the first surface 92a side, two first bottomed grooves 94a and 94b are disposed in the first surface 92a from the circumferential surface 92c toward the inside (center portion) of the lid 92. The first grooves 94a and 94b are disposed on one imaginary line C1 of imaginary lines C1 and C2 each of which passes through a center G of the first surface 92a and divides the first surface 92a into two portions. In other words, the first grooves 94a and 94b are disposed at positions line-symmetrical about the other imaginary line C2. The first grooves 94a and 94b are disposed from the circumferential surface 92c of the lid 92 toward the inside (center portion) so as to have a portion overlapping the opening of the recess when the lid 92 is placed so as to close the opening of the recess that is opened in the upper surface of the package 9. In other words, an end of each of the first grooves 94a and 94b on the center portion side is disposed so as to reach the inside (center side of the package in plan view) of the inner wall of the frame-like side wall 912 disposed at the circumferential edge of the upper surface of the bottom plate 911 constituting the base 91.

Similarly to the first surface 92a, two second grooves 94a' and 94b' are disposed in the second surface 92b. The two second grooves 94a' and 94b' are disposed on one imaginary line C1 of imaginary lines C1 and C2 each of which passes through a center G of the second surface 92b and divides the second surface 92b into two portions, similarly to the first surface 92a. In other words, the second grooves 94a' and 94b' are disposed at positions line-symmetrical about the other imaginary line C2. The second grooves 94a' and 94b' are disposed from the circumferential surface 92c of the lid 92 toward the center portion so as to have a portion overlapping the opening of the recess that is opened in the upper surface of the package 9 when the lid 92 is placed so as to close the opening of the recess. In other words, an end of each of the second grooves 94a' and 94b' on the center portion side is disposed so as to reach the inside (center side of the package in plan view) of the inner wall of the frame-like side wall 912 disposed at the circumferential edge of the upper surface of the bottom plate 911 constituting the base 91.

By disposing the first grooves 94a and 94b and the second grooves 94a' and 94b' as described above, the lid 92 can be set without distinguishing between the front and back sides, and evacuation can be performed through the first grooves 94a and 94b or the second grooves 94a' and 94b'.

Then, evacuation of the recess (the interior space 14) is performed through gaps formed between the package 9 and the bonding surface due to the first grooves 94a and 94b or the second grooves 94a' and 94b', and thereafter, the portions of the first grooves 94a and 94b or the second grooves 94a' and 94b' are melted by a laser beam or the like and closed, so that hermetically sealing is performed.

In the lid 92 as described above, the four bottomed grooves, that is, the first grooves 94a and 94b and the second grooves 94a' and 94b' are disposed so as to overlap each other in the first surface 92a and the second surface 92b, respectively, when the lid 92 is planarly viewed from the first surface 92a side. This example has been described using an example in which four bottomed grooves are disposed so as to overlap each other in the first surface 92a and the second surface 92b when the lid 92 is planarly viewed from the first surface 92a side. However, the arrangement of grooves is not limited to this. Other examples of the arrangement of grooves will be described in detail in modified examples described later.

According to the lid 92 having the form described above, when the lid 92 and the package 9 are bonded together, the portions of the first grooves 94a and 94b or the second grooves 94a' and 94b' on the bonding surface side to the package 9 are not bonded by seam welding. Further, the first grooves 94a and 94b or the second grooves 94a' and 94b' on the bonding surface side to the package 9 are opened in the circumferential surface 92c, and ends of the grooves extending on the center portion side are disposed inside of the inner wall of the side wall 912, that is, disposed so as to reach the recess (the interior space 14). Hence, evacuation of the recess (the interior space 14) can be performed through either the first grooves 94a and 94b or the second grooves 94a' and 94b' that are not bonded. Moreover, since the first grooves 94a and 94b or the second grooves 94a' and 94b' are previously disposed in the lid 92, it becomes unnecessary to perform, for example, dimension management of an unbonded portion (evacuation hole) used for evacuation as performed in the related art. Therefore, evacuation and bonding can be stably performed.

Further, since the first grooves 94a and 94b and the second grooves 94a' and 94b' disposed in the first surface 92a and the second surface 92b that are in a front-and-back relation to each other are disposed, the lid 92 can be placed on the package 9 as a bonding member without distinguishing between the front and back sides.

Moreover, the first grooves 94a and 94b and the second grooves 94a' and 94b' are disposed on one imaginary line C1 of the imaginary lines C1 and C2 each of which passes through the center G of the first surface 92a or the second surface 92b and divides the first surface 92a or the second surface 92b into two portion. Moreover, the first grooves 94a and 94b and the second grooves 94a' and 94b' are disposed at the positions line-symmetrical about the other imaginary line C2. Due to this, when the first grooves 94a and 94b and the second grooves 94a' and 94b' are sealed, the sealing can be performed by welding the same place. That is, sealing can be performed without changing the welding position, which is effective for reducing the number of sealing steps and for sealing stability.

Modified Examples of Lid

Figure 10A:
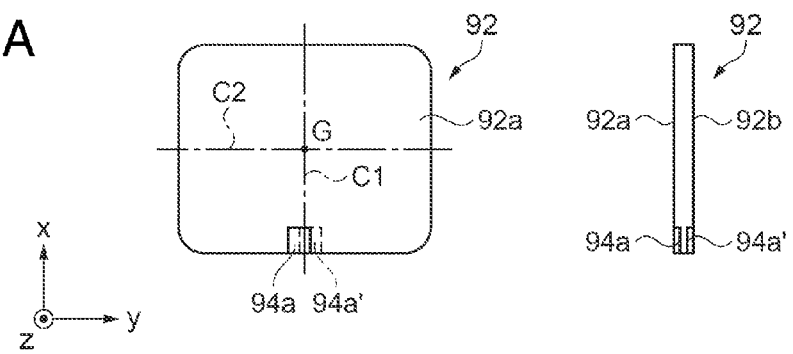
Figure 10B:
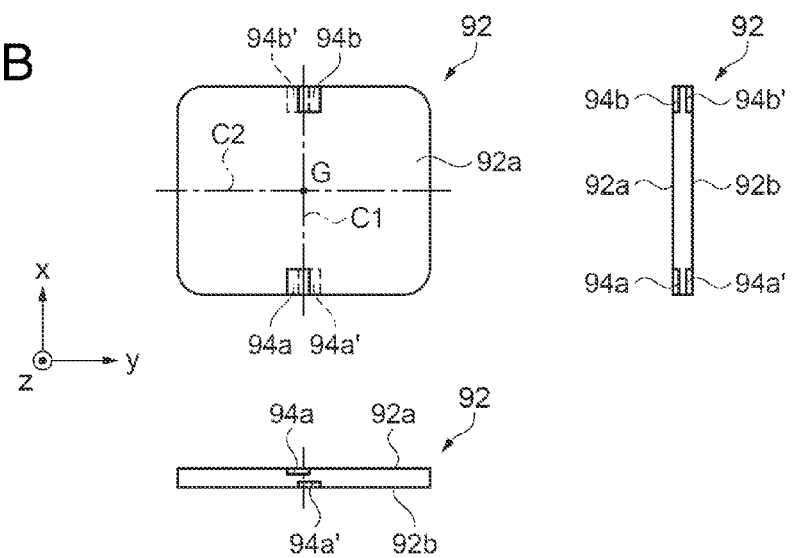
Figure 10C:
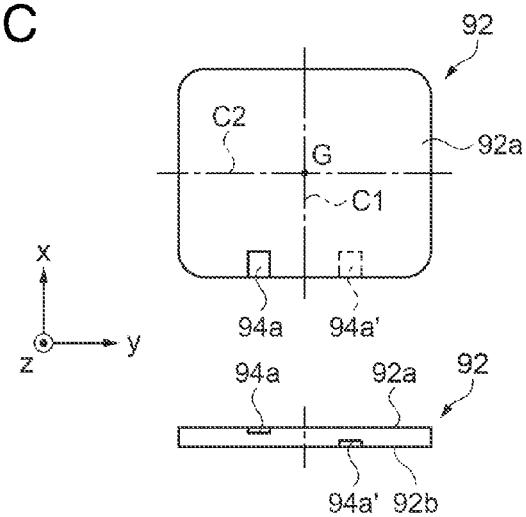
Figure 11A:
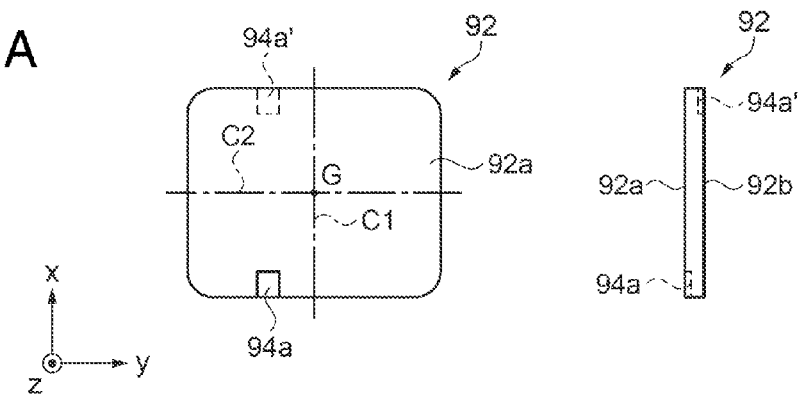
Figure 11B:
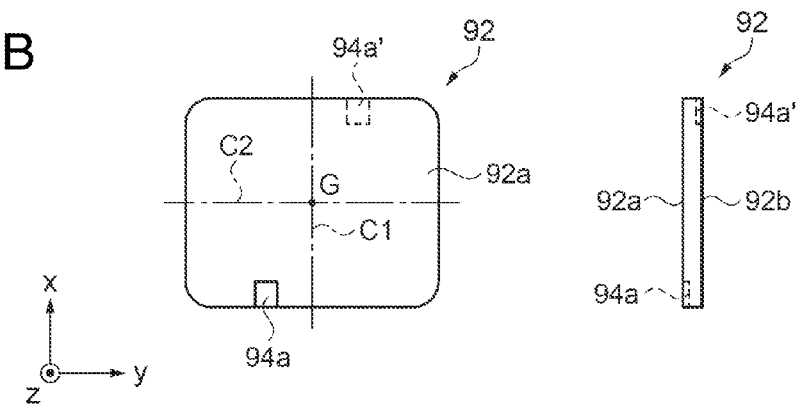
Figure 11C:
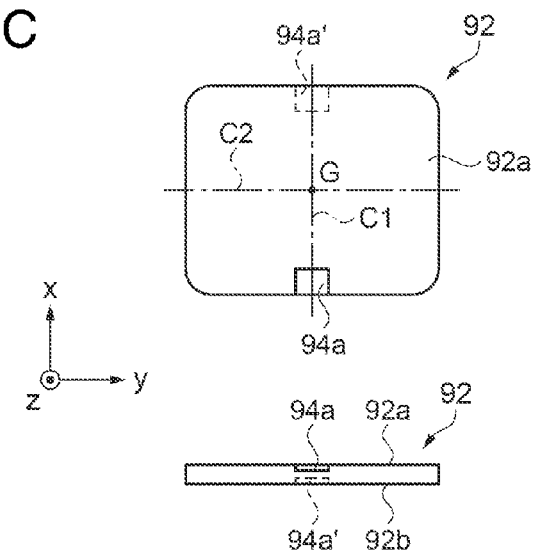

Next, modified examples of a lid as a cover body will be described with reference to FIGS. 10A to 11C. FIG. 10A shows Modified Example 1; FIG. 10B shows Modified Example 2; and FIG. 10C shows Modified Example 3. FIG. 11A shows Modified Example 4; FIG. 11B shows Modified Example 5; and FIG. 11C shows Modified Example 6. The description of the same configurations as those of the embodiments described above is omitted.

Modified Example 1 of Lid

Modified Example 1 of a lid will be described according to FIG. 10A, in which the left part is a plan view; and the right part is a right side view. The lid 92 of Modified Example 1 has a configuration in which one bottomed groove is disposed in each of the first surface 92a and the second surface 92b.

Specifically speaking, the first groove 94a is disposed in the first surface 92a as a bottomed groove that is opened at one side portion of the circumferential surface of the lid 92 and disposed therefrom toward the center portion of the lid 92. In other words, the first groove 94a is disposed on the imaginary line C1 that passes through the center G of the first surface 92a and divides each of the first surface 92a and the second surface 92b into two portions, and arranged to be slightly shifted leftward in the drawing (negative y-axis direction) with respect to the imaginary line C1.

On the side opposite to the first surface 92a, that is, in the second surface 92b, the second groove 94a' is disposed at a position overlapping the first groove 94a in plan view. The second groove 94a' is disposed in the second surface 92b as a bottomed groove that is opened at one side portion (the same side portion as that at which the first groove 94a is opened) of the circumferential surface of the lid 92 and disposed therefrom toward the center portion of the lid 92. In other words, the second groove 94a' is disposed on the imaginary line C1 that passes through the center G of the second surface 92b and divides each of the first surface 92a and the second surface 92b into two portions, and arranged to be slightly shifted rightward in the drawing (y-axis direction) with respect to the imaginary line C1.

As described above, the first groove 94a and the second groove 94a' are disposed at positions at which the first groove 94a and the second groove 94a' at least partially overlap each other in plan view. Hence, when the lid 92 is placed on the package (not shown), the position of the first groove 94a or the second groove 94a' serving as an evacuation hole can be imagined from a plane (top). Due to this, sealing can be easily performed. Moreover, in the arrangement of this example, when the lid 92 is turned around the imaginary line C1, the first groove 94a is arranged at the position of the second groove 94a' before turning. Hence, by configuring the arrangement such that when the lid 92 is turned around the imaginary line C1, the first groove 94a is arranged at the position of the second groove 94a' before turning, even when the lid 92 is set upside down, the first groove 94a or the second groove 94a' is arranged at the same position. Therefore, sealing can be performed at the same position, which is efficient.

Modified Example 2 of Lid

Next, Modified Example 2 of a lid will be described according to FIG. 10B, in which the left part shows a plan view and an elevation view; and the right part is a right side view. The lid 92 of Modified Example 2 has a configuration in which two bottomed grooves are disposed in each of the first surface 92a and the second surface 92b.

Specifically speaking, the first grooves 94a and 94b are disposed in the first surface 92a of the lid 92, while the second grooves 94a' and 94b' are disposed in the second surface 92b. The first groove 94a is disposed in the first surface 92a as a bottomed groove that is opened at one side portion of the circumferential surface of the lid 92 and disposed therefrom toward the center portion of the lid 92. In other words, the first groove 94a is disposed on the imaginary line C1 that passes through the center G of the first surface 92a and divides each of the first surface 92a and the second surface 92b into two portions, and arranged to be slightly shifted leftward in the drawing (negative y-axis direction) with respect to the imaginary line C1. The other first groove 94b is disposed in the first surface 92a at a position point-symmetrical to the first groove 94a about the center G of the first surface 92a. That is, the first groove 94b is a bottomed groove that is opened in the circumferential surface of the lid 92 and disposed therefrom toward the center portion of the lid 92. In other words, the first groove 94b is disposed on the imaginary line C1 that passes through the center G of the first surface 92a and divides each of the first surface 92a and the second surface 92b into two portions, and arranged to be slightly shifted rightward in the drawing (y-axis direction) with respect to the imaginary line C1.

On the side opposite to the first surface 92a in which the first groove 94a is disposed, that is, in the second surface 92b, the second groove 94a' is disposed at a position overlapping the first groove 94a in plan view. The second groove 94a' is disposed in the second surface 92b as a bottomed groove that is opened at one side portion (the same side portion as that at which the first groove 94a is opened) of the circumferential surface of the lid 92 and disposed therefrom toward the center portion of the lid 92. In other words, the second groove 94a' is disposed on the imaginary line C1 that passes through the center G of the second surface 92b and divides each of the first surface 92a and the second surface 92b into two portions, and arranged to be slightly shifted rightward in the drawing (y-axis direction) with respect to the imaginary line C1. The other second groove 94b' is disposed in the second surface 92b at a position point-symmetrical to the second groove 94a' about the center G of the second surface 92b. That is, the second groove 94b' is a bottomed groove that is opened in the circumferential surface of the lid 92 and disposed therefrom toward the center portion of the lid 92. In other words, the second groove 94b' is disposed on the imaginary line C1 that passes through the center G of the first surface 92a and divides each of the first surface 92a and the second surface 92b into two portions, and arranged to be slightly shifted leftward in the drawing (negative y-axis direction) with respect to the imaginary line C1.

As described above, the first groove 94a (the first surface 92a) and the second groove 94a' (the second surface 92b), and the first groove 94b (the first surface 92a) and the second groove 94b' (the second surface 92b) are disposed respectively at positions at which the grooves at least partially overlap each other. Hence, when the lid 92 is placed on the package (not shown), the positions of the first groove 94a or the second groove 94a' and the first groove 94b or the second groove 94b' serving as evacuation holes can be imagined from a plane (top of the lid 92 on the first surface 92a side). Due to this, sealing can be easily performed.

Moreover, in the arrangement of this example, the first groove 94a and the first groove 94b disposed in the first surface 92a, and the second groove 94a' and the second groove 94b' disposed in the second surface 92b are arranged at positions point-symmetrical about the center G of the lid 92. Moreover, the first groove 94a and the second groove 94a', and the first groove 94b and the second groove 94b' are arranged such that when the lid 92 is turned around the imaginary line C1, the respective grooves in the front and back sides are replaced with each other and located at the same positions. Hence, in setting the lid 92 on the package, even when the lid 92 is turned in any way, any grooves of the first groove 94a, the second groove 94a', the first groove 94b, and the second groove 94b' are arranged at the same position. Due to this, in setting the lid 92 on the package, the setting can be performed without considering the direction of the lid 92, which dramatically improves workability. Also, sealing can be performed at the same position, which can enhance work efficiency.

Modified Example 3 of Lid

Next, Modified Example 3 of a lid will be described according to FIG. 10C, in which the upper part is a plan view; and the bottom part is an elevation view. The lid 92 of Modified Example 3 has a configuration in which one bottomed groove is disposed in each of the first surface 92a and the second surface 92b at different positions in plan view.

Specifically speaking, the first groove 94a is disposed in the first surface 92a as a bottomed groove that is opened at one side portion of the circumferential surface of the lid 92 and disposed therefrom toward the center portion of the lid 92. The first groove 94a is arranged to be shifted, in the drawing, to the left (negative y-axis direction) of the imaginary line C1 that passes through the center G of the first surface 92a and divides each of the first surface 92a and the second surface 92b into two portions.

In the second surface 92b, the second groove 94a' is disposed at a position line-symmetrical to the first groove 94a about the imaginary line C1 in plan view. Hence, the second groove 94a' is arranged to be shifted, in the drawing, to the right (y-axis direction) of the imaginary line C1. The second groove 94a' is disposed in the second surface 92b as a bottomed groove that is opened at one side portion (the same side portion as that at which the first groove 94a is opened) of the circumferential surface of the lid 92 and disposed therefrom toward the center portion of the lid 92.

As described above, since the first groove 94a and the second groove 94a' are disposed at the different positions in plan view, it is possible to increase the wall thickness of remaining members at the portions at which the first groove 94a and the second groove 94a' are disposed. Due to this, a melting allowance (melt volume) when sealing an evacuation hole (the first groove 94a or the second groove 94a') can be increased, so that sealing can be performed more stably.

Moreover, in the case where the first groove 94a and the second groove 94a' are arranged at the positions line-symmetrical about the imaginary line C1 in plan view as in Modified Example 3, when the lid 92 is turned around the imaginary line C1, the first groove 94a is located at the position of the second groove 94a' before turning. Due to this, even when the lid 92 is set upside down on the package, the first groove 94a or the second groove 94a' is arranged at the same position. Therefore, sealing can be performed at the same position, which is efficient.

Modified Example 4 of Lid

Next, Modified Example 4 of a lid will be described according to FIG. 11A, in which the left part is a plan view; and the right part is a right side view. The lid 92 of Modified Example 4 has a configuration in which one bottomed groove is disposed in each of the first surface 92a and the second surface 92b at different positions in plan view.

Specifically speaking, the first groove 94a is disposed in the first surface 92a as a bottomed groove that is opened at one side portion of the circumferential surface of the lid 92 and disposed therefrom toward the center portion of the lid 92. The first groove 94a is arranged to be shifted, in the drawing, to the left (negative y-axis direction) of the imaginary line C1 of the imaginary lines C1 and C2 each of which passes through the center G of the first surface 92a and divides each of the first surface 92a and the second surface 92b into two portions.

In the second surface 92b, the second groove 94a' is disposed at a position line-symmetrical to the first groove 94a about the imaginary line C2 in plan view. Hence, the second groove 94a' is arranged to be shifted, in the drawing, to the left (negative y-axis direction) of the imaginary line C1. The second groove 94a' is disposed in the second surface 92b as a bottomed groove that is opened at one side portion of the circumferential surface of the lid 92, where the one side portion (side portion on the opposite side) faces the side portion at which the first groove 94a is opened, and disposed therefrom toward the center portion of the lid 92.

As described above, since the first groove 94a and the second groove 94a' are disposed at the different positions in plan view, it is possible to increase the wall thickness of the members at the portions at which the first groove 94a and the second groove 94a' are disposed. Due to this, a melting allowance (melt volume) when sealing an evacuation hole (the first groove 94a or the second groove 94a') can be increased, so that sealing can be performed more stably.

Moreover, in the case where the first groove 94a and the second groove 94a' are arranged at the positions line-symmetrical about the imaginary line C2 in plan view as in Modified Example 4, when the lid 92 is turned around the imaginary line C2, the first groove 94a is located at the position of the second groove 94a' before turning. Due to this, even when the lid 92 is set upside down on the package, the first groove 94a or the second groove 94a' is arranged at the same position. Therefore, sealing can be performed at the same position, which is efficient.

Modified Example 5 of Lid

Next, Modified Example 5 of a lid will be described according to FIG. 11B, in which the left part is a plan view; and the right part is a right side view. The lid 92 of Modified Example 5 has a configuration in which one bottomed groove is disposed in each of the first surface 92a and the second surface 92b at different positions in plan view.

Specifically speaking, the first groove 94a is disposed in the first surface 92a as a bottomed groove that is opened at one side portion of the circumferential surface of the lid 92 and disposed therefrom toward the center portion of the lid 92. The first groove 94a is arranged to be shifted, in the drawing, to the left (negative y-axis direction) of the imaginary line C1 of the imaginary lines C1 and C2 each of which passes through the center G of the first surface 92a and divides each of the first surface 92a and the second surface 92b into two portions.

In the second surface 92b, the second groove 94a' is disposed at a position point-symmetrical to the first groove 94a about the center G of the lid 92 in plan view. Hence, the second groove 94a' is arranged to be shifted, in the drawing, to the right (y-axis direction) of the imaginary line C1. The second groove 94a' is disposed in the second surface 92b as a bottomed groove that is opened at one side portion of the circumferential surface of the lid 92, where the one side portion (side portion on the opposite side) faces the side portion at which the first groove 94a is opened, and disposed therefrom toward the center portion of the lid 92.

As described above, since the first groove 94a and the second groove 94a' are disposed at the different positions in plan view, it is possible to increase the wall thickness of the members at the portions at which the first groove 94a and the second groove 94a' are disposed. Due to this, a melting allowance (melt volume) when sealing an evacuation hole (the first groove 94a or the second groove 94a') can be increased, so that sealing can be performed more stably.

Modified Example 6 of Lid

Next, Modified Example 6 of a lid will be described according to FIG. 11C, in which the top part is a plan view; and the bottom part is an elevation view. The lid 92 of Modified Example 6 has a configuration in which one bottomed groove is disposed in each of the first surface 92a and the second surface 92b at different positions in plan view.

Specifically speaking, the first groove 94a is disposed in the first surface 92a as a bottomed groove that is opened at one side portion of the circumferential surface of the lid 92 and disposed therefrom toward the center portion of the lid 92. The first groove 94a is disposed in a line-symmetrical shape about the imaginary line C1 of the imaginary lines C1 and C2 each of which passes through the center G of the first surface 92a and divides each of the first surface 92a and the second surface 92b into two portions.

In the second surface 92b, the second groove 94a' is disposed at a position line-symmetrical to the first groove 94a about the imaginary line C2 in plan view. The second groove 94a' is also disposed in a line-symmetrical shape about the imaginary line C1. The second groove 94a' is disposed in the second surface 92b as a bottomed groove that is opened at one side portion of the circumferential surface of the lid 92, where the one side portion (side portion on the opposite side) faces the side portion at which the first groove 94a is opened, and disposed therefrom toward the center portion of the lid 92. Hence, the first groove 94a and the second groove 94a' are disposed at positions and in a shape point-symmetrical about the center G of the lid 92 in plan view.

As described above, since the first groove 94a and the second groove 94a' are disposed at the different positions in plan view, it is possible to increase the wall thickness of the members at the portions at which the first groove 94a and the second groove 94a' are disposed. Due to this, a melting allowance (melt volume) when sealing an evacuation hole (the first groove 94a or the second groove 94a') can be increased, so that sealing can be performed more stably.

Moreover, by disposing the first groove 94a and the second groove 94a' at the positions and in the shape point-symmetrical about the center G of the lid 92 in plan view as in Modified Example 6, when the lid 92 is turned around the imaginary line C2, the first groove 94a is located at the position of the second groove 94a' before turning. Due to this, even when the lid 92 is set upside down on the package, the first groove 94a or the second groove 94a' is arranged at the same position. Therefore, sealing can be performed at the same position, which is efficient.

In the above description, the invention has been described using an example in which the first groove and the second groove are disposed at one edge of the lid 92, or at two edges facing each other. However, the invention is not limited to this. Similar advantageous effects are provided even with a configuration in which the first groove and the second groove are disposed at other edges.

When the first groove and the second groove are made into a pair, a plurality of pairs may be disposed. By disposing a plurality of pairs of first and second grooves as described above, evacuation ability can be improved, so that evacuation speed can be increased. Due to this, the efficiency of sealing work can be enhanced.

Moreover, the cross-sectional shape of each of the first groove and the second groove may be any shape such as a rectangular shape, a semicircle shape, or a tapered shape (wedge shape) as long as the groove has a function as an evacuation hole.

Method for Manufacturing Vibrator

A method for manufacturing the vibrator 1 in the second embodiment is similar to that of the first embodiment, and therefore, the description thereof is omitted.

According to the second embodiment, the first grooves 94a and 94b and the second grooves 94a' and 94b' of the lid 92 as a cover body closing the accommodating portion are disposed from the circumferential surface 92c of the lid 92 toward the center portion in the first surface 92a and the second surface 92b of the lid 92 that are in a front-and-back relation to each other. When the lid 92 is bonded to the base 91 (the package 9), the portions at which the first grooves 94a and 94b or the second grooves 94a' and 94b' are disposed are not bonded, so that evacuation can be performed through either the first grooves 94a and 94b or the second grooves 94a' and 94b' that are not bonded. Moreover, since the first grooves 94a and 94b and the second grooves 94a' and 94b' are previously disposed in the lid 92, the first grooves 94a and 94b and the second grooves 94a' and 94b' serve as they are as evacuation holes. Therefore, it becomes unnecessary to perform, for example, dimension management of an unbonded portion (evacuation hole) used for evacuation, as performed in the related art, and evacuation and bonding (sealing) are stably performed. Therefore, even when the vibrator 1 is heated at a high temperature after bonding (sealing), gas to be generated can be suppressed. Moreover, with the stable evacuation and bonding (sealing), it is possible to prevent the characteristic deterioration of the gyro element 2 as an element accommodated in the package 9 due to an influence of a residual gas or the like, so that the vibrator 1 as an electronic device having stable characteristics can be provided.

Third Embodiment of Electronic Device

Figure 12:
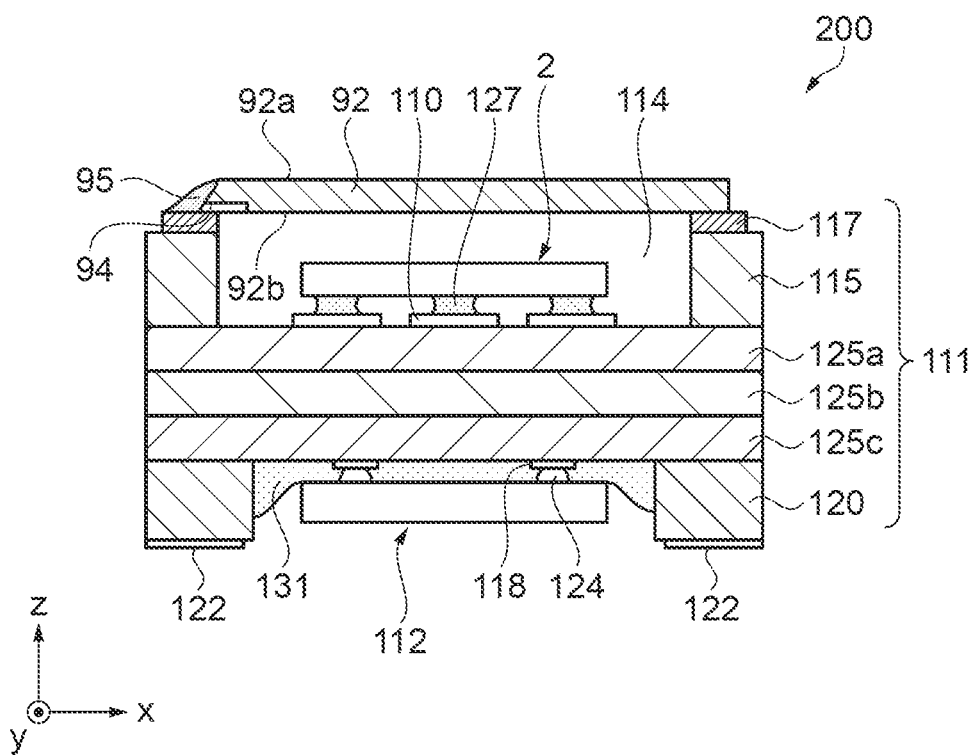
FIG. 12 is a front cross-sectional view schematically showing a gyro sensor as a third embodiment of an electronic device.

Next, as a third embodiment of an electronic device, an embodiment of a gyro sensor will be described with reference to FIG. 12. FIG. 12 is a front cross-sectional view schematically showing the gyro sensor. In the embodiment, configurations similar to those of the first embodiment are denoted by the same reference numerals and signs, and the description thereof is omitted in some cases.

The gyro sensor 200 includes the gyro element 2 as an electronic component, an IC 112 as a circuit element, a package (base) 111 as a container, and the lid 92 as a cover body. The package 111 is formed of ceramic or the like and includes a third substrate 125c, a second substrate 125b, and a first substrate 125a stacked on top of one another, a frame-like side wall 115 disposed at a circumferential edge of a surface of the first substrate 125a, and a frame-like side wall 120 disposed at a circumferential edge of a surface of the third substrate 125c.

On an upper surface of the frame-like side wall 115, a seam ring 117 formed of, for example, an alloy such as Kovar is formed. The seam ring 117 has a function as a bonding material to the lid 92 and is disposed in a frame shape (circumferential shape) along the upper surface of the side wall 115. In the lid 92, the groove 94 is disposed at an edge of the back surface 92b as a surface facing the seam ring 117. The configuration of the lid 92 is similar to that of the first embodiment. The groove 94 is formed so as to reach an interior space 114 when the lid 92 is placed on the seam ring 117. A space surrounded by the surface of the first substrate 125a and an inner wall of the frame-like side wall 115 serves as the interior space 114 of the gyro element 2, while a space surrounded by the third substrate 125c and an inner wall of the frame-like side wall 120 serves as an accommodating portion 116 of the IC 112. The interior space 114 in which the gyro element 2 is accommodated is sealed by the sealing portion 95 after performing evacuation (degassing) through the groove 94. The sealing portion 95 is formed by melting and then solidifying the lid 92 left at the portion at which the groove 94 is formed. On a surface (lower surface in the drawing) of the frame-like side wall 120, a plurality of external terminals 122 are disposed.

In the interior space 114 of the gyro element 2, connection pads 110 are formed on the surface of the first substrate 125a. The gyro element 2 is fixed with the connections pad 110 while making an electrical connection therewith. For this connection, conductive fixing members 127 such as solder, silver paste, or a conductive adhesive (adhesive having a conductive filler, such as metal particles, dispersed in a resin material) can be used. In this case, the gyro element 2 has a gap relative to the upper surface of the first substrate 125a due to the thickness of the conductive fixing member 127.

An opening of the interior space 114 in which the gyro element 2 is accommodated is closed by the lid 92 as a cover body and hermetically sealed. The lid 92 has a configuration similar to that of the lid 92 described in the first embodiment. Therefore, the detailed description thereof is omitted, and the lid 92 will be schematically described. The lid 92 closes the opening of the interior space 114 that is opened in an upper surface of the package 111, and is bonded around the opening using, for example, a seam welding method or the like. The lid 92, for which a Kovar plate is used, includes the front surface 92a and the back surface 92b that are in a front-and-back relation to each other. Similarly to the first embodiment, the bottomed groove 94 disposed on the back surface 92b side from the circumferential surface toward the center portion of the lid 92 is disposed in the lid 92. Then, evacuation of the interior space 114 is performed through the groove 94 as a gap between the seam ring 117 and the lid 92, and thereafter, a portion including an end of the groove 94 is melted by a laser beam or the like and solidified, so that hermetical sealing is performed.

On the other hand, connection electrodes 118 are formed on the surface of the third substrate 125c in the accommodating portion 116 of the IC 112. The connection electrodes 118 and the IC 112 are fixed by bonding using gold (Au) bumps 124 or the like while making an electrical connection therebetween. An underfill 131 such as resin is disposed to be filled in a gap between the IC 112 and the surface of the third substrate 125c. The resin may be disposed so as to cover the IC 112. Although the connection pads 110, the connection electrodes 118, the external terminals 122, and the like are connected using internal wires or the like, the description thereof, including the illustration in the drawing, is omitted in the invention.

Method for Manufacturing Gyro Sensor

Next, a method for manufacturing the gyro sensor 200 will be described. However, the description of steps similar to those described in the method for manufacturing the vibrator 1 is omitted. The steps to be omitted are: the step of accommodating the gyro element 2 in the interior space 114 of the package 111 as a base; the step of placing the lid 92 over the interior space 114; the first bonding step of bonding the lid 92 to the package 111; and the second bonding step of hermetically sealing the interior space 114 whose evacuation is finished.

In addition to the steps described above, in the manufacture of the gyro sensor 200, the IC 112 is accommodated in the accommodating portion 116 of the IC 112 surrounded by the frame-like side wall 120 disposed at the circumferential edge of the surface of the third substrate 125c. The IC 112 is fixed using the gold (Au) bumps 124 to the connection electrodes 118 disposed on the surface of the third substrate 125c while making an electrical connection therewith. The underfill 131 such as resin is filled in the gap between the IC 112 and the surface of the third substrate 125c, so that the gap is filled. Through the steps described above, the gyro sensor 200 is completed.

According to the third embodiment, the fluidity of the molten metal (the lid 92) melted by a laser beam becomes favorable similarly to the first embodiment, so that the formation of the sealing portion 95 can be reliably performed. Hence, the sealing of the groove 94 can be reliably performed, so that it is possible to manufacture the gyro sensor 200 as an electronic device with improved hermetic reliability. Moreover, since the groove 94 is used as it is as an evacuation hole, it becomes unnecessary to perform, for example, dimension management of an unbonded portion (evacuation hole) used for evacuation, as performed in the related art. Therefore, since evacuation and bonding (sealing) are stably performed, even when the gyro sensor 200 is heated at a high temperature after bonding (sealing), gas to be generated can be suppressed. Moreover, with the stable evacuation and bonding (sealing), it is possible to prevent the characteristic deterioration of the gyro element 2 as an electronic component accommodated in the package 111 due to an influence of a residual gas or the like, so that the gyro sensor 200 as an electronic device having stable characteristics can be provided.

In the description of the electronic device, the invention has been described using, by way of example, the vibrator 1 and the gyro sensor 200 in each of which the gyro element 2 of a so-called double T-type is used as an electronic component. However, the invention is not limited to this, and can be applied to an electronic device that hermetically accommodates an element in a package. Examples of other electronic devices may include, for example, a gyro sensor using an H-type or tuning fork-type gyro element as an electronic component, a timing device (a vibrator, an oscillator, or the like) using a vibrating element, a pressure sensor using a pressure-sensitive element, and a semiconductor device using a semiconductor element.

As a vibrating element, it is possible to preferably use a piezoelectric vibrating element such as a MEMS element using a piezoelectric body, or a quartz crystal vibrating reed that performs bending vibration such as a tuning fork-type quartz crystal vibrating reed using quartz crystal as a raw material, a longitudinal vibration-type quartz crystal vibrating reed, a thickness-shear quartz crystal vibrating reed, or the like.

Moreover, the invention has been described using an example in which a lid is used as a cover body. However, the invention is not limited to this. For example, a so-called cap having a flange disposed at its circumference and a center portion molded in a depressed shape can also be used as a cover body.

Electronic Apparatus

Next, electronic apparatuses to which the vibrator 1 or the gyro sensor 200 as an electronic device according to an embodiment of the invention is applied will be described in detail with reference to FIGS. 13 to 16. In the description, examples to which the vibrator 1 using the gyro element 2 is applied are shown.

Figure 13:
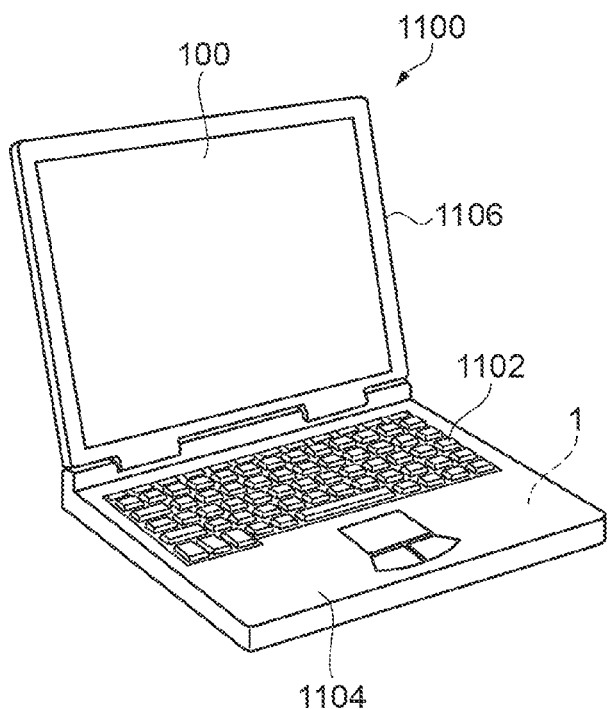
FIG. 13 is a perspective view showing the configuration of a mobile personal computer as an example of an electronic apparatus.

FIG. 13 is a perspective view showing a schematic configuration of a mobile (or notebook) personal computer as an electronic apparatus including the vibrator 1 as an electronic device according to an embodiment of the invention. In the drawing, the personal computer 1100 is composed of a main body portion 1104 including a keyboard 1102 and a display unit 1106 including a display portion 100. The display unit 1106 is rotatably supported relative to the main body portion 1104 via a hinge structure portion. In the personal computer 1100, the vibrator 1 using the gyro element 2 that has a function of detecting an angular velocity is incorporated.

Figure 14:
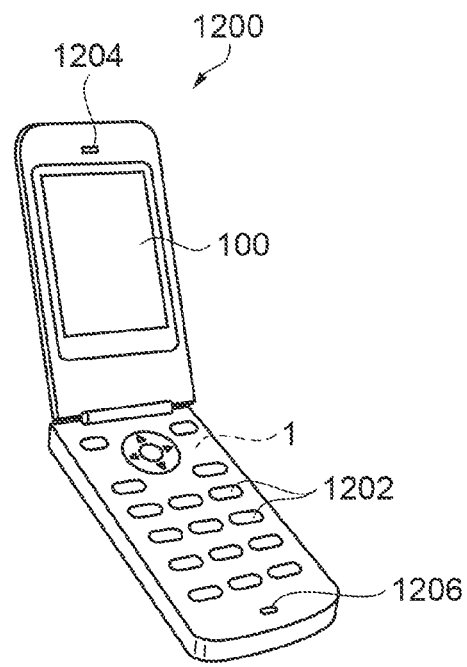
FIG. 14 is a perspective view showing the configuration of a mobile phone as an example of an electronic apparatus.

FIG. 14 is a perspective view showing a schematic configuration of a mobile phone (including a PHS) as an electronic apparatus including the vibrator 1 as an electronic device according to an embodiment of the invention. In the drawing, the mobile phone 1200 includes a plurality of operation buttons 1202, an earpiece 1204, and a mouthpiece 1206. The display portion 100 is arranged between the operation buttons 1202 and the earpiece 1204. In the mobile phone 1200, the vibrator 1 using the gyro element 2 that functions as an angular velocity sensor or the like is incorporated.

Figure 15:
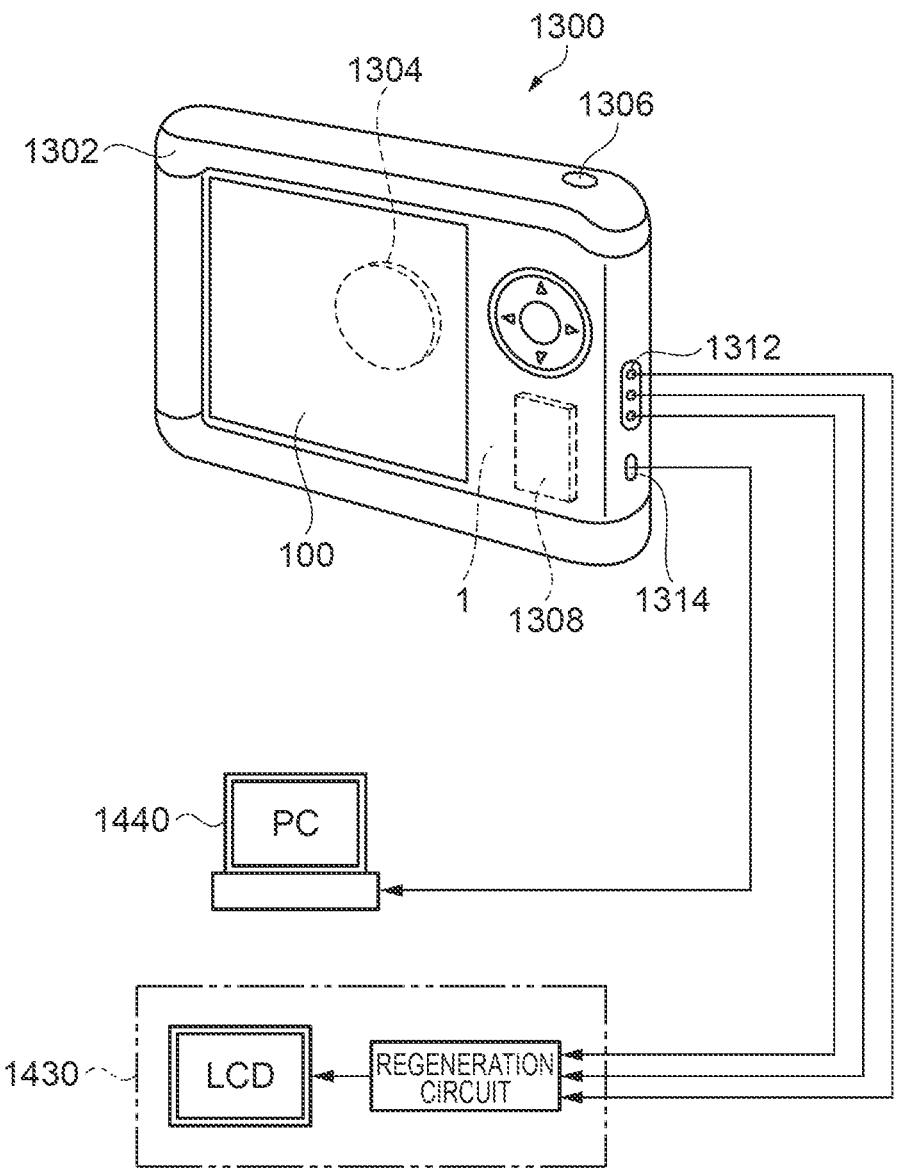
FIG. 15 is a perspective view showing the configuration of a digital still camera as an example of an electronic apparatus.

FIG. 15 is a perspective view showing a schematic configuration of a digital still camera as an electronic apparatus including the vibrator 1 as an electronic device according to an embodiment of the invention. In the drawing, also connections with external apparatuses are shown in a simplified manner. Film cameras expose a silver halide photographic film with an optical image of a subject; whereas the digital still camera 1300 generates imaging signals (image signals) by photoelectrically converting an optical image of a subject with an imaging element such as a CCD (Charge Coupled Device).

The display portion 100 is disposed on the back surface of a case (body) 1302 in the digital still camera 1300 and configured to perform display based on imaging signals generated by a CCD. The display portion 100 functions as a finder that displays a subject as an electronic image. Moreover, on the front side (the rear side in the drawing) of the case 1302, a light receiving unit 1304 including an optical lens (imaging optical system) and a CCD is disposed.

When a photographer confirms a subject image displayed on the display portion 100 and presses down a shutter button 1306, imaging signals of a CCD at the time are transferred to and stored in a memory 1308. Moreover, in the digital still camera 1300, a video signal output terminal 1312 and a data communication input/output terminal 1314 are disposed on the side surface of the case 1302. Then, as shown in the drawing, a television monitor 1430 and a personal computer 1440 are connected as necessary to the video signal output terminal 1312 and the data communication input/output terminal 1314, respectively. Further, the imaging signals stored in the memory 1308 are output to the television monitor 1430 or the personal computer 1440 by a predetermined operation. In the digital still camera 1300, the vibrator 1 using the gyro element 2 that functions as an angular velocity sensor or the like is incorporated.

In addition to the personal computer (mobile personal computer) in FIG. 13, the mobile phone in FIG. 14, and the digital still camera in FIG. 15, the vibrator 1 according to an embodiment of the invention can be applied to electronic apparatuses such as, for example, inkjet ejection apparatuses (for example, inkjet printers), laptop personal computers, television sets, video camcorders, video tape recorders, car navigation systems, pagers, electronic notebooks (including those with communication function), electronic dictionaries, calculators, electronic gaming machines, word processors, workstations, videophones, surveillance television monitors, electronic binoculars, POS terminals, medical equipment (for example, electronic thermometers, sphygmomanometers, blood glucose meters, electrocardiogram measuring systems, ultrasonic diagnosis apparatuses, and electronic endoscopes), fishfinders, various types of measuring instrument, indicators (for example, indicators used in vehicles, aircraft, and ships), and flight simulators.

Moving Object

Figure 16:
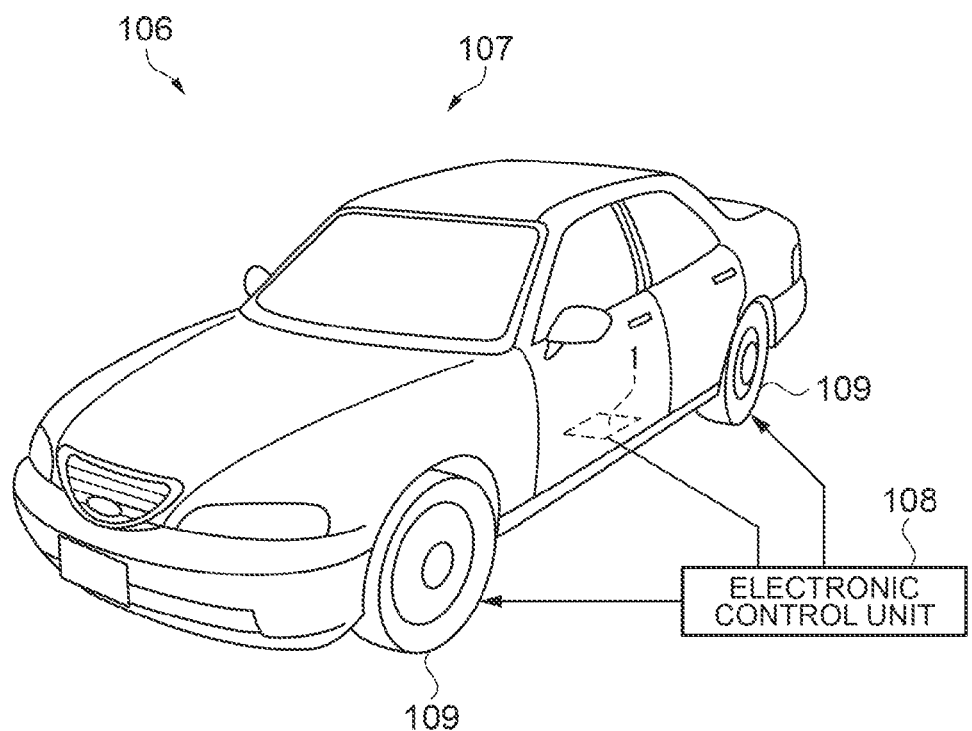
FIG. 16 is a perspective view showing the configuration of an automobile as an example of a moving object.

FIG. 16 is a perspective view schematically showing an automobile as an example of a moving object. On the automobile 106, the vibrator 1 as an electronic device according to the invention is mounted. For example as shown in the drawing, in the automobile 106 as a moving object, an electronic control unit 108 that incorporates therein the vibrator 1 using the gyro element 2 and controls tires 109 or the like is mounted on an automobile body 107. In addition, the vibrator 1 can be widely applied to electronic control units (ECUs) such as for keyless entry systems, immobilizers, car navigation systems, car air-conditioners, anti-lock brake systems (ABSs), air bags, tire pressure monitoring systems (TPMSs), engine control, battery monitors for hybrid and electric automobiles, and automobile body attitude control systems.

The entire disclosure of Japanese Patent Application Nos. 2012-257159, filed Nov. 26, 2012; 2012-257160, filed Nov. 26, 2012 and 2012-257164, filed Nov. 26, 2012 are expressly incorporated by reference herein.

What is claimed is:

1. A method for manufacturing an electronic device, in which a base and a cover body are bonded together while forming an interior space for accommodating an electronic component between the base and the cover body, the method comprising:

a step of preparing the cover body including a groove communicating the interior space with the outside, the groove being in a surface of the cover body on the side to be bonded with the base;

a step of accommodating the electronic component in the interior space;

a first bonding step of bonding the base and the cover body together by welding at an area for bonding the base and the cover body together except for an unwelded portion including a portion at which the base and the cover body are not welded due to the groove; and a second bonding step of bonding the base and the cover body together by energy beam welding at a portion of the area for bonding, the portion including an end of the groove on the outside side, to thereby close the groove.

2. The method for manufacturing an electronic device according to claim 1, wherein
the first bonding step is a step of performing the bonding by seam welding.

3. The method for manufacturing an electronic device according to claim 2, wherein
at least one of the base and the cover body includes a metal layer, the metal layer having a thickness smaller than the depth of the groove, and
in the first bonding step, the metal layer is melted by the seam welding to bond the base and the cover body together.

4. The method for manufacturing an electronic device according to claim 1, wherein
the relation of L1>L2 is satisfied, where L1 is the width of the groove, and L2 is the depth of the groove.

5. The method for manufacturing an electronic device according to claim 2, wherein
the outline of the cover body in plan view is a rectangular shape, and
in the first bonding step, the seam welding is performed along each side of the cover body in plan view.

6. The method for manufacturing an electronic device according to claim 5, wherein
the groove is disposed at a side portion of the cover body in plan view.

7. The method for manufacturing an electronic device according to claim 1, wherein
using a plate-like cover body including a circumferential surface connecting a front surface with a back surface, the base and the cover body are bonded together through the first bonding step.

8. The method for manufacturing an electronic device according to claim 7, wherein
the groove has one of ends opened in the circumferential surface of the cover body and the other end disposed at a position facing the interior space, and
the base and the cover body are bonded together through the first bonding step.

9. The method for manufacturing an electronic device according to claim 7, wherein
in the second bonding step, the base and the cover body are bonded by energy beam welding at a portion of the area for bonding, the portion including one of ends of the groove on the outside side.

10. The method for manufacturing an electronic device according to claim 1, further comprising, after the first bonding step, a step of performing evacuation of the interior space through the groove, wherein
the second bonding step is disposed after the step of performing the evacuation.

* * * * *